US009847618B2

(12) United States Patent
Nogiwa et al.

(10) Patent No.: US 9,847,618 B2
(45) Date of Patent: Dec. 19, 2017

(54) LASER APPARATUS

(71) Applicant: Gigaphoton Inc., Tochigi (JP)

(72) Inventors: Seiji Nogiwa, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/218,294

(22) Filed: Jul. 25, 2016

(65) Prior Publication Data
US 2016/0336713 A1    Nov. 17, 2016

Related U.S. Application Data

(63) Continuation of application No. PCT/JP2014/054538, filed on Feb. 25, 2014.

(51) Int. Cl.
| | |
|---|---|
| *H01S 3/13* | (2006.01) |
| *H01S 3/23* | (2006.01) |
| *G02B 19/00* | (2006.01) |
| *H05G 2/00* | (2006.01) |
| *H01S 3/223* | (2006.01) |

(52) U.S. Cl.
CPC ........ *H01S 3/1305* (2013.01); *G02B 19/0095* (2013.01); *H01S 3/13* (2013.01); *H01S 3/2316* (2013.01); *H01S 3/2366* (2013.01); *H05G 2/003* (2013.01); *H01S 3/1307* (2013.01); *H01S 3/2232* (2013.01); *H05G 2/008* (2013.01)

(58) Field of Classification Search
CPC .... H01S 3/1305; H01S 3/2232; H01S 3/2316; H01S 3/2366; H01S 3/13; H05G 2/003; H05G 2/008; G02B 19/0095
See application file for complete search history.

(56) References Cited

U.S. PATENT DOCUMENTS

2010/0078577 A1    4/2010  Moriya et al.
2014/0348188 A1*  11/2014  Suganuma ............ H01S 3/2391
                                                                 372/20

FOREIGN PATENT DOCUMENTS

| JP | 11-145537 A | 5/1999 |
|---|---|---|
| JP | 2009-277977 A | 11/2009 |
| WO | 2012/073087 A1 | 6/2012 |
| WO | 2012/114178 A2 | 8/2012 |
| WO | 2013/144690 A1 | 10/2013 |

OTHER PUBLICATIONS

International Search Report issued in PCT/JP2014/054538; dated May 27, 2014.

* cited by examiner

*Primary Examiner* — Dung Nguyen
(74) *Attorney, Agent, or Firm* — Studebaker & Brackett PC

(57) ABSTRACT

A laser apparatus may include a beam splitter configured to split a pulse laser beam into a first beam path and a second beam path, an optical sensor provided in the first beam path, an amplifier including an amplification region provided in the second beam path and being configured to amplify and emit the pulse laser beam incident thereon along the second beam path, a wavefront controller provided in the second beam path between the beam splitter and the amplifier, and a processor configured to receive an output signal from the optical sensor and transmit a control signal to the wavefront controller.

4 Claims, 18 Drawing Sheets

000001
LASER APPARATUS

TECHNICAL FIELD

The present disclosure relates to a laser apparatus.

BACKGROUND ART

In recent years, as semiconductor processes become finer, transfer patterns for use in photolithographies of semiconductor processes have rapidly become finer. In the next generation, microfabrication at 70 nm to 45 nm, and further, microfabrication with 32 nm or less will be demanded. In order to meet the demand for microfabrication at 32 nm or less, for example, the development of an exposure apparatus in which an apparatus for generating extreme ultraviolet (EUV) light at a wavelength of approximately 13 nm is combined with a reduced projection reflective optics is expected.

As the apparatus for generating EUV light, three types of apparatuses have been proposed, which include a Laser Produced Plasma (LPP) type apparatus using plasma generated by irradiating a target material with a laser beam, a Discharge Produced Plasma (DPP) type apparatus using plasma generated by electric discharge, and a Synchrotron Radiation (SR) type apparatus using synchrotron radiation.

SUMMARY

A laser apparatus according to an aspect of the present disclosure includes: a beam splitter configured to split a pulse laser beam into a first beam path and a second beam path; an optical sensor provided in the first beam path; an amplifier including an amplification region provided in the second beam path and being configured to amplify and emit the pulse laser beam incident thereon along the second beam path; a wavefront controller provided in the second beam path between the beam splitter and the amplifier; and a processor configured to receive an output signal from the optical sensor and transmit a control signal to the wavefront controller.

A laser apparatus according to another aspect of the present disclosure includes: a first beam splitter configured to split a pulse laser beam into a first beam path and a second beam path; a first optical sensor provided in the first beam path; an amplifier including an amplification region provided in the second beam path and being configured to amplify and emit the pulse laser beam incident thereon along the second beam path; a wavefront controller provided in the second beam path between the first beam splitter and the amplifier; a second beam splitter configured to split the pulse laser beam emitted from the amplifier into a third beam path and a fourth beam path; a second optical sensor provided in the third beam path; and a processor configured to receive an output signal from the first optical sensor and transmit a first control signal to the wavefront controller and, after that, receive an output signal from the second optical sensor and transmit a second control signal to the wavefront controller.

BRIEF DESCRIPTION OF DRAWINGS

Hereinafter, various embodiments of the present disclosure will be described, as mere examples, with reference to the accompanying drawings.

DESCRIPTION OF EMBODIMENTS

Figure 1:
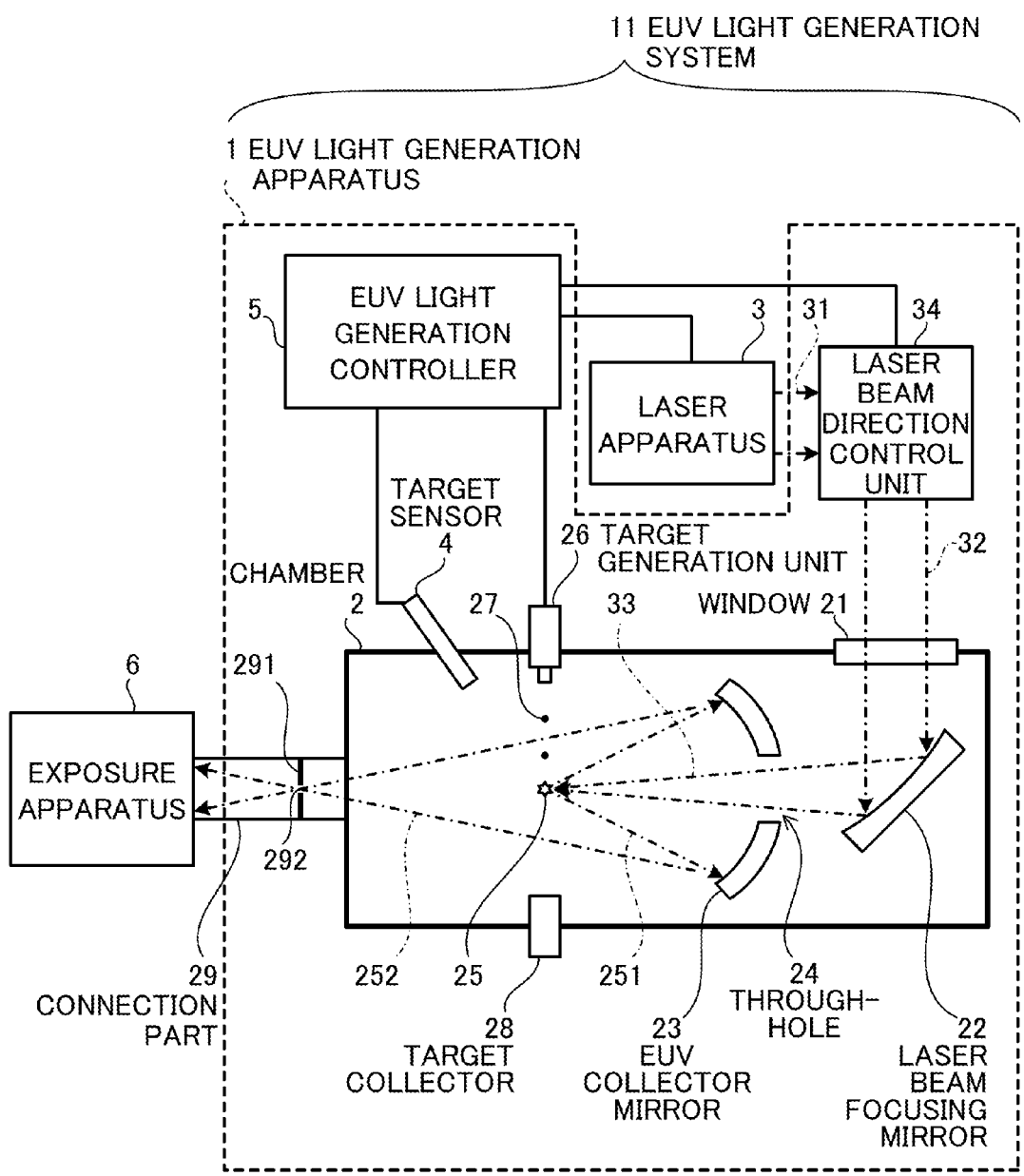
FIG. 1 schematically illustrates a configuration of an exemplary LPP type EUV light generation system.

Hereinafter, various embodiments of the present disclosure will be described in detail with reference to the drawings. The embodiments to be described below represent some examples of the present disclosure, and do not limit the scope of the present disclosure. Further, the configuration(s) and operation(s) described in each embodiment are not all essential as the configuration(s) and operation(s) of the present disclosure. Corresponding elements are referenced by corresponding reference symbols, and duplicate descriptions thereof will be omitted herein.

<Contents>
1. Overview
2. Overview of EUV Light Generation System
   2.1 Configuration
   2.2 Operation
3. Laser Apparatus Including Wavefront Controller (First Embodiment)
   3.1 Overview of Configuration
   3.2 Details of Configuration
   3.2.1 Amplifier
   3.2.2 Wavefront Controller
   3.2.3 Beam Characteristics Measurement Unit
   3.2.4 Processor
   3.3 Operation
   3.3.1 Main Flow
   3.3.2 Calculation of Beam Characteristics
      3.3.2.1 Calculation of Win
      3.3.2.2 Calculation of $W_{0m}$ and Zwm
      3.3.2.3 Calculation of $M^2$ and Rin
   3.3.3 Calculation of Target Value of Focal Power
   3.4 Others
4. Laser Apparatus That Performs Beam Diameter Control (Second Embodiment)
   4.1 Configuration
   4.2 Operation
   4.2.1 Main Flow
   4.2.2 Calculation of Win(k+1)
   4.2.3 Setting of Target Value of Focal Power
   4.3 Working Effects
5. Laser Apparatus That Determines Whether to Perform Beam Control (Third Embodiment)
   5.1 Main Flow
   5.2 Analysis of Beam Profile
6. Laser Apparatus That Performs Beam Control across a Plurality of Amplifiers (Fourth Embodiment)
7. Others
   7.1 Examples of Amplifier
   7.1.1 First Example
   7.1.2 Second Example
   7.2 Examples of Wavefront Controller
   7.2.1 First Example
   7.2.2 Second Example
   7.2.3 Third Example
   7.3 Configuration of Processor

1. OVERVIEW

In an LPP type EUV light generation system, a target material outputted into a chamber may be turned into plasma by being irradiated with a laser beam outputted from a laser apparatus. Then, light including EUV light may be emitted from the plasma. The emitted EUV light may be collected by an EUV collector mirror provided inside the chamber, and outputted to an external apparatus such as an exposure apparatus.

The laser apparatus may include an amplifier configured to amplify a pulse laser beam outputted from a master oscillator. However, a change in temperature of an optical element provided between the master oscillator and the amplifier may cause the optical element to deform and thus cause the wavefront of the pulse laser beam to fluctuate. The fluctuation of the wavefront of the pulse laser beam may sometimes cause the beam diameter of the pulse laser beam to be enlarged inside the amplifier. Moreover, a part of the pulse laser beam may be reflected by an electrode inside the amplifier or blocked by an element around an opening of the amplifier to have a beam profile that is different from the desired beam profile.

It is conceivable to provide a wavefront controller between the master oscillator and the amplifier and perform feedback control on the wavefront controller on the basis of the pulse laser beam that is outputted from the amplifier. However, reflection of a part of the pulse laser beam by the electrode inside the amplifier or blockage of a part of the pulse laser beam by the element around the opening of the amplifier may complicate the beam profile of the pulse laser beam that is outputted from the amplifier. The complicated beam profile may make it difficult to perform feedback control on the wavefront controller.

According to an aspect of the present disclosure, a wavefront controller may be provided in a beam path of the pulse laser beam upstream from the amplifier. A beam characteristics measurement unit including a beam splitter and an optical sensor may be provided in a beam path of the pulse laser beam further upstream from the wavefront controller. A processor may transmit a control signal to the wavefront controller in accordance with an output signal from the beam characteristics measurement unit. This makes it possible to measure the beam characteristics of the pulse laser beam near the wavefront controller, moreover, may prevent a part of the pulse laser beam from being undesirably reflected by the electrode inside the amplifier or being undesirably blocked by the element around the opening of the amplifier.

2. OVERVIEW OF EUV LIGHT GENERATION SYSTEM 2.1 Configuration

FIG. 1 schematically illustrates a configuration of an exemplary LPP type EUV light generation system. An EUV light generation apparatus 1 may be used with at least one laser apparatus 3. In the present disclosure, a system that includes the EUV light generation apparatus 1 and the laser apparatus 3 may be referred to as an EUV light generation system 11. As shown in FIG. 1 and described in detail below, the EUV light generation apparatus 1 may include a chamber 2 and a target generation unit 26. The chamber 2 may be sealed airtight. The target generation unit 26 may be mounted onto the chamber 2 to penetrate a wall of the chamber 2. A target material to be outputted from the target generation unit 26 may include, but is not limited to, tin, terbium, gadolinium, lithium, xenon, or the combination of any two or more of them.

The chamber 2 may have at least one through-hole in its wall. A window 21 may be provided on the through-hole, and a pulse laser beam 32 outputted from the laser apparatus 3 may travel through the window 21. An EUV collector mirror 23 having a spheroidal reflective surface, for example, may be provided in the chamber 2. The EUV collector mirror 23 may have first and second focusing points. The EUV collector mirror 23 may have, on the surface thereof, a multi-layered reflective film in which molybdenum and silicon are alternately laminated, for example. The EUV collector mirror 23 may be preferably positioned such that the first focusing point lies in a plasma generation region 25 and the second focusing point lies in an intermediate focus (IF) region 292. If necessary, the EUV collector mirror 23 may have a through-hole 24 at the center thereof, and a pulse laser beam 33 may travel through the through-hole 24.

The EUV light generation apparatus 1 may include an EUV light generation controller 5, a target sensor 4, and the like. The target sensor 4 may have an imaging function and may be configured to detect the presence, the trajectory, the position, the speed, etc. of a target 27.

The EUV light generation apparatus 1 may include a connection part 29 for allowing the interior of the chamber 2 to be in communication with the interior of the exposure apparatus 6. A wall 291 having an aperture may be provided in the connection part 29. The wall 291 may be positioned such that the aperture is positioned at the second focusing point of the EUV collector mirror 23.

Further, the EUV light generation apparatus 1 may also include a laser beam direction control unit 34, a laser beam focusing mirror 22, a target collector 28 for collecting targets 27, and the like. The laser beam direction control unit 34 may include an optical element for defining the travel direction of a pulse laser beam and an actuator for adjusting, the position and the posture of the optical element.

2.2 Operation

With continued reference to FIG. 1, a pulse laser beam 31 outputted from the laser apparatus 3 may pass through the laser beam direction control unit 34, travel through the window 21 as the pulse laser beam 32, and enter the chamber 2. The pulse laser beam 32 may travel inside the chamber 2 along at least one laser beam path, be reflected by the laser beam focusing mirror 22, and strike at least one target 27 as the pulse laser beam 33.

The target generation unit 26 may be configured to output the target(s) 27 toward the plasma generation region 25 in the chamber 2. The target 27 may be irradiated with at least one pulse of the pulse laser beam 33. The target 27 having been irradiated with the pulse laser beam may be turned into plasma, and radiated light 251 may be emitted from the plasma. The EUV collector mirror 23 may reflect EUV light included in the radiated light 251 with higher reflectance as compared with light of other wavelength regions. Reflected light 252 including the EUV light, which is reflected by the EUV collector mirror 23, may be focused on the intermediate focus region 292 and be outputted to the exposure apparatus 6. Here, one target 27 may be irradiated with multiple pulses included in the pulse laser beam 33.

The EUV light generation controller 5 may be configured to integrally control the whole EUV light generation system 11. The EUV light generation controller 5 may be configured to process image data of the target 27 captured by the target sensor 4, and the like. Further, the EUV light generation controller 5 may be configured to control the timing at which the target 27 is outputted, the direction into which the target 27 is outputted, and the like. Furthermore, the EUV light generation controller 5 may be configured to control the timing at which the laser apparatus 3 oscillates, the direction in which the pulse laser beam 32 travels, the position at which the pulse laser beam 33 is focused, and the like. The various controls mentioned above are merely examples, and other controls may be added as necessary.

3. LASER APPARATUS INCLUDING WAVEFRONT CONTROLLER (FIRST EMBODIMENT)

3.1 Overview of Configuration

Figure 2:
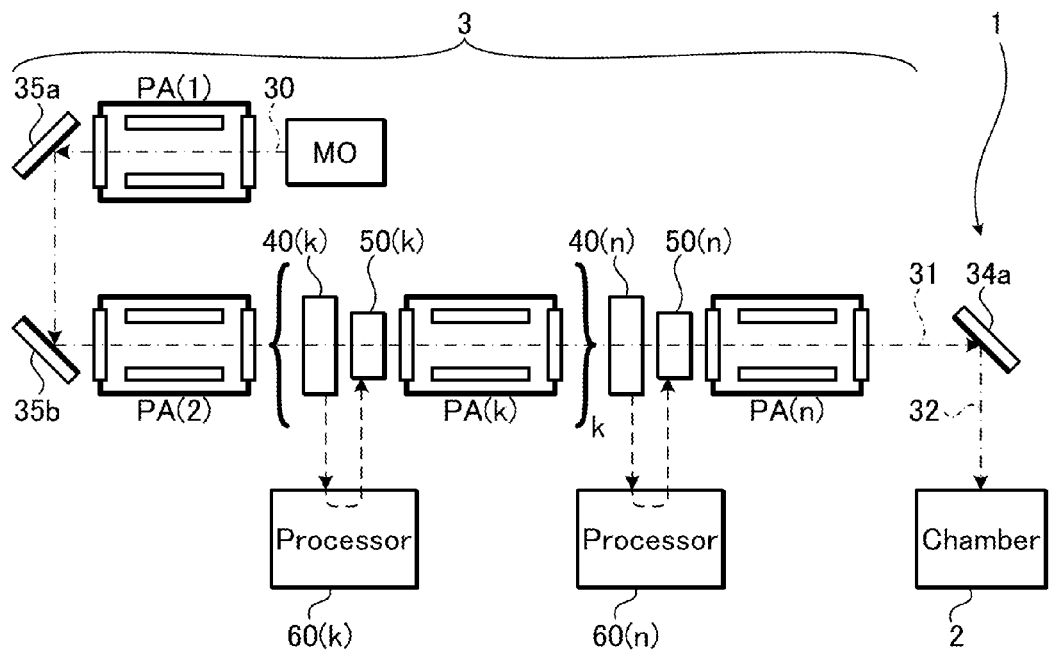
FIG. 2 is a partial sectional view illustrating a configuration of a laser apparatus according to a first embodiment of the present disclosure.

FIG. 2 is a partial sectional view illustrating a configuration of a laser apparatus 3 according to a first embodiment of the present disclosure. The laser apparatus 3 may include a master oscillator MO and a plurality of amplifiers PA(1), PA(2), . . . , and PA(n). The master oscillator MO may output a pulse laser beam 30, and the plurality of amplifiers PA(1), PA(2), . . . , and PA(n) may be provided in a beam path of the pulse laser beam 30 to amplify the pulse laser beam 30 in sequence. A relay optical system including high-reflection mirrors 35a and 35b and the like may be provided between the plurality of amplifiers PA(1), PA(2), . . . , and PA(n).

The number of amplifiers may be n. The following description assumes that n is an integer of 2 or greater. Note, however, that n may be 1. Further, in the following description, any one of the plurality of amplifiers PA(1), PA(2), . . . , and PA(n), excluding the final-stage amplifier PA(n), may be represented by PA(k). The amplifier of the stage following the amplifier PA(k) may be represented by PA (k+1).

A wavefront controller $50(k)$ may be provided in a beam path of the pulse laser beam 30 upstream from the amplifier PA(k). A beam characteristics measurement unit $40(k)$ may be provided further upstream from the wavefront controller $50(k)$. A processor $60(k)$ may transmit a control signal to the wavefront controller $50(k)$ on the basis of data outputted from the beam characteristics measurement unit $40(k)$. A wavefront controller $50(n)$ and a beam characteristics measurement unit $40(n)$ may be provided upstream from the final-stage amplifier PA(n). A processor $60(n)$ may transmit a control signal to the wavefront controller $50(n)$ on the basis of data outputted from the beam characteristics measurement unit $40(n)$.

Note, however, that a wavefront controller or a beam characteristics measurement unit does not need to be provided upstream from the first-stage amplifier PA(1) or upstream from the second-stage amplifier PA(2). The pulse laser beam 30 may have smaller energy upstream from the first-stage amplifier PA(1) or upstream from the second-stage amplifier PA(2) than it does downstream therefrom. In a case where the pulse laser beam 30 has small energy, deformation of an optical element due to heating of the optical element may not tend to occur. This may decrease the need for wavefront adjustment by the present disclosure.

A pulse laser beam outputted from the final-stage amplifier PA(n) may enter the laser beam direction control unit 34a as a pulse laser beam 31. A pulse laser beam 32 having exited from the laser beam direction control unit 34a may enter the chamber 2.

3.2 Details of Configuration

Figure 3:
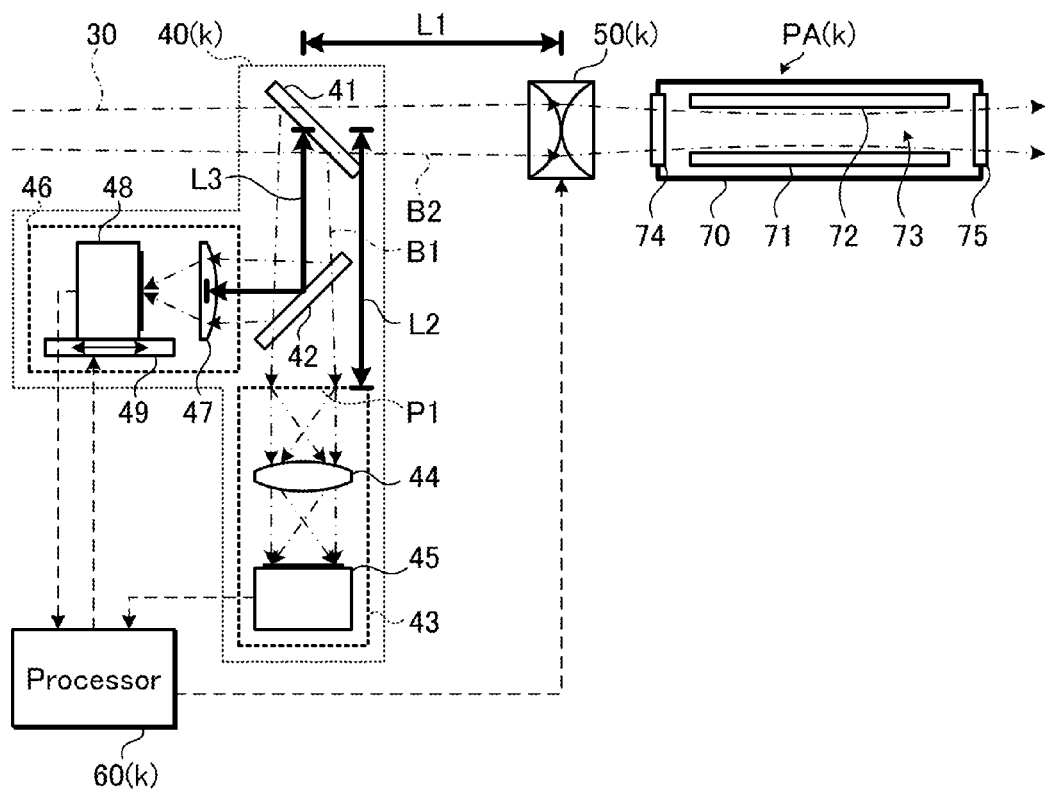
FIG. 3 is an enlarged view of one amplifier, one wavefront controller, one beam characteristics measurement unit, and one processor that are shown in FIG. 2.
Figure 4A:
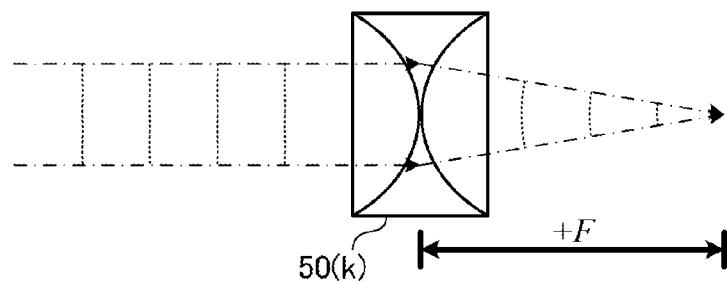
FIGS. 4A and 4B are diagrams for discussing a function of the wavefront controller.
Figure 4B:
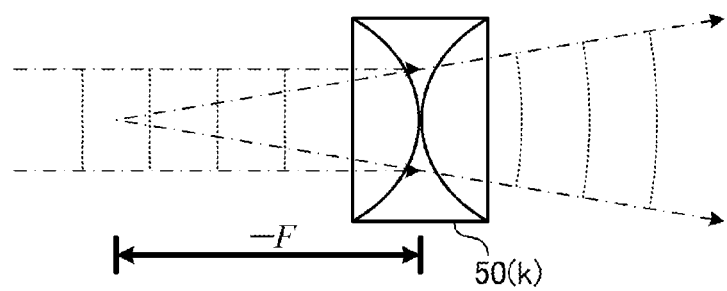
Figure 5:
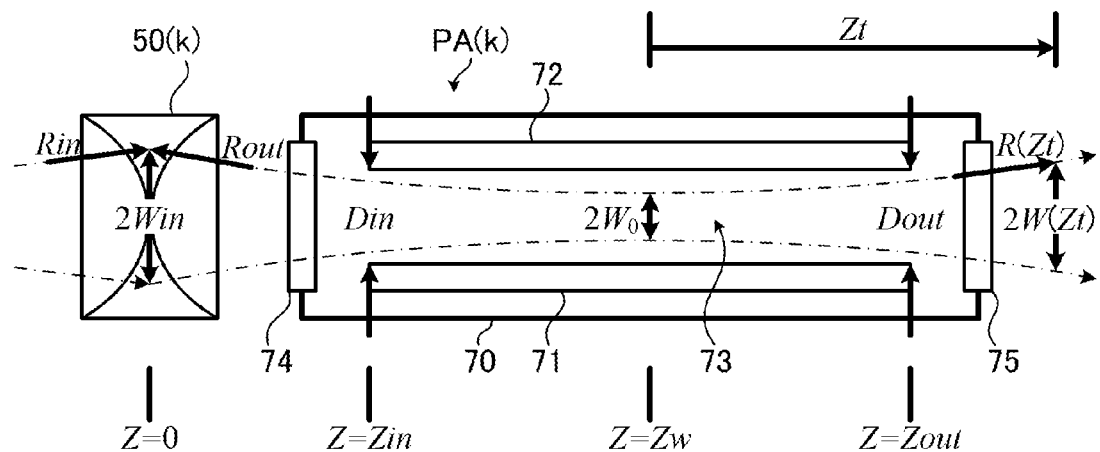
FIG. 5 is an enlarged view of one wavefront controller and one amplifier.

FIG. 3 is an enlarged view of one amplifier PA(k), one wavefront controller $50(k)$, one beam characteristics measurement unit $40(k)$, and one processor $60(k)$ that are shown in FIG. 2. Each of FIGS. 4A and 4B is a diagram for discussing a function of the wavefront controller $50(k)$. FIG. 5 is an enlarged view of one wavefront controller $50(k)$ and one amplifier PA(k).

3.2.1 Amplifier

The amplifier PA(k) may include a laser chamber 70 and a pair of electrodes 71 and 72. A laser gas containing a $CO_2$ gas may be enclosed in the laser chamber 70. A high-frequency power supply (not shown) may apply a high voltage between the electrodes 71 and 72 to generate discharge that excites the laser gas to form an amplification region 73 between the electrodes 71 and 72. When the pulse laser beam 30 enters through an entrance window 74 to the laser chamber 70, the pulse laser beam 30 may be amplified and outputted through an exit window 75.

3.2.2 Wavefront Controller

As shown in FIG. 4A, the wavefront controller 50(k) may convert a pulse laser beam having a planar wavefront into a pulse laser beam having a concave wavefront. As shown in FIG. 4B, the wavefront controller 50(k) may convert a pulse laser beam having a planar wavefront into a pulse laser beam having a convex wavefront.

That is, the wavefront controller 50(k) may be an optical element that is capable of converting a wavefront of a pulse laser beam as shown in FIG. 4A or as shown in FIG. 4B. Further, the wavefront controller 50(k) may be capable of converting a wavefront having a given curvature in a given range into a wavefront having another given curvature in the given range.

When the wavefront controller 50(k) is controlled to have a focal length F, the focal power Pw of the wavefront controller 50(k) may be expressed in the following expression.

$$Pw = 1/F$$

When F is a positive value, a pulse laser beam having a planar wavefront may be converted into a pulse laser beam having a concave wavefront that is focused at a point distanced by the focal length F, in the forward direction, from the principal point of the wavefront controller 50(k) (see FIG. 4A).

When F is a negative value, a pulse laser beam having a planar wavefront may be converted into a pulse laser beam having a convex wavefront that is equivalent to a wavefront of a light generated from a virtual point light source at a position distanced by the focal length F, in the backward direction, from the principal point of the wavefront controller 50(k) (see FIG. 4B).

3.2.3 Beam Characteristics Measurement Unit

The description follows with continued reference to FIG. 3.

The beam characteristics measurement unit 40(k) may include a beam splitter 41, a beam splitter 42, a beam profile measuring instrument 43, and a beam waist measuring instrument 46.

The beam splitter 41 may reflect a part of the pulse laser beam 30 and transmit the remaining part of the pulse laser beam 30 with high transmittance. By doing so, the beam splitter 41 may split the pulse laser beam 30 into a first beam path B1 through which reflected light passes and a second beam path B2 through which transmitted light passes. The wavefront controller 50(k) and the amplifier PA(k) may be provided in the second beam path B2. The beam splitter 41 may correspond to the first beam splitter of the present disclosure.

The beam splitter 42, provided in the first beam path B1, may transmit a part of a pulse laser beam toward the beam profile measuring instrument 43 and reflect the remaining part toward the beam waist measuring instrument 46.

The beam profile measuring instrument 43 may include a transfer optical system 44 and an optical sensor 45. The transfer optical system 44 may transfer a beam cross-sectional image at a predetermined position P1 on a beam path of the pulse laser beam onto the photosensitive surface of the optical sensor 45. The optical sensor 45 may be an image sensor. The optical sensor 45 may output data of a beam intensity distribution of the pulse laser beam at the predetermined position P1 as an output signal to the processor 60(k). A distance L1 along the second beam path B2 from the beam splitter 41 to the wavefront controller 50(k) and a distance L2 along the first beam path B1 from the beam splitter 41 to the predetermined position P1 may be substantially equal. The optical sensor 45 may correspond to the first optical sensor of the present disclosure.

The beam waist measuring instrument 46 may include a focusing optical system 47, an optical sensor 48, and a uniaxial stage 49.

Figure 6:
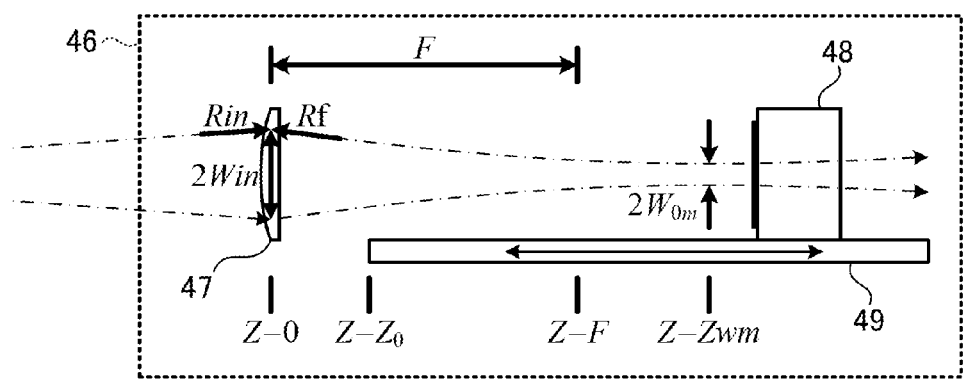
FIG. 6 is an enlarged view of a beam waist measuring instrument.

FIG. 6 is an enlarged view of the beam waist measuring instrument 46. Note, however, that FIG. 6 shows a left-right reversal of the beam waist measuring instrument 46 shown in FIG. 3.

The focusing optical system 47 may focus a pulse laser beam. In accordance with a control signal that is outputted from the processor 60(k), the uniaxial stage 49 may move the optical sensor 48 along a beam axis of the pulse laser beam that is focused by the focusing optical system 47. The optical sensor 48 may be an image sensor. The optical sensor 48 may output data of a beam intensity distribution of the pulse laser beam at multiple positions to which the optical sensor 48 is moved by the uniaxial stage 49 as an output signal to the processor 60(k). The distance L1 along the second beam path B2 from the beam splitter 41 to the wavefront controller 50(k) and a distance L3 along the first beam path B1 from the beam splitter 41 to the focusing optical system 47 may be substantially equal. The optical sensor 48 may correspond to the first optical sensor of the present disclosure.

3.2.4 Processor

The processor 60(k) may calculate the beam radius Win of the pulse laser beam at the predetermined position P1 on the basis of the data of the beam intensity distribution received from the beam profile measuring instrument 43. Since the above-described distances L1 and L2 are substantially equal, the beam radius Win of the pulse laser beam at the predetermined position P1 may be treated as being equal to the beam radius Win of the pulse laser beam incident on the wavefront controller 50(k). FIG. 5 shows the beam radius Win of the pulse laser beam incident on the wavefront controller 50(k).

On the basis of the data of the beam intensity distribution at the multiple positions received from the beam waist measuring instrument 46, the processor 60(k) may calculate the beam waist radius $W_{0m}$ and beam waist position Zwm of the pulse laser beam that is focused by the focusing optical system 47. The beam waist position Zwm may be a distance along a beam axis to the position of a beam waist based on the position of the focusing optical system 47. FIG. 6 shows the beam waist radius $W_{0m}$ and the beam waist position Zwm.

The processor 60(k) may calculate the curvature radius Rin of the wavefront of the pulse laser beam incident on the focusing optical system 47 and the M square value $M^2$ of the pulse laser beam incident on the focusing optical system 47 on the basis of the beam waist radius $W_{0m}$, the beam waist position Zwm, and the beam radius Win of the pulse laser beam incident on the focusing optical system 47. FIG. 6 shows the beam radius Win of the pulse laser beam incident on the focusing optical system 47 and the curvature radius Rin of the wavefront of the pulse laser beam incident on the focusing optical system 47. Since the above-described distances L1 and L3 are substantially equal, the value of the beam radius Win (see FIG. 5) of the pulse laser beam incident on the wavefront controller 50(k) may be used as the beam radius Win of the pulse laser beam incident on the focusing optical system 47.

Since the above-described distances L1 and L3 are substantially equal, the M square value $M^2$ of the pulse laser beam incident on the focusing optical system 47 and the curvature radius Rin of the wavefront of the pulse laser beam incident on the focusing optical system 47 may be treated as being equal to the M square value $M^2$ of the pulse laser beam incident on the wavefront controller 50(k) and the curvature radius Rin of the wavefront of the pulse laser beam incident on the wavefront controller 50(k). FIG. 5 shows the curvature radius Rin of the wavefront of the pulse laser beam incident on the wavefront controller 50(k).

The processor 60(k) may calculate a target value Pwt of the focal power of the wavefront controller 50(k) on the basis of the following values calculated on the basis of the data received from the beam characteristics measurement unit 40(k) as described above:

Win: Beam radius of the pulse laser beam incident on the wavefront controller 50(k). It should be noted that the beam radius refers to the radius of a region having beam intensity equal to or greater than $1/e^2$ of the peak value of beam intensity in a beam intensity distribution.

$M^2$: M square value that represents the focusing performance of the pulse laser beam incident on the wavefront controller 50(k).

Rin: Curvature radius of the wavefront of the pulse laser beam incident on the wavefront controller 50(k). It should be noted that the curvature radius of the wavefront takes on a positive value in a case where the front side of the wavefront has a concave surface and takes on a negative value in a case where the front side of the wavefront has a convex surface.

The target value Pwt of the focal power may be calculated as such a value that the pulse laser beam 30 reduces the maximum value of its beam diameter between first and second positions positioned with the amplification region 73 of the amplifier PA(k) interposed therebetween. To calculate the target value Pwt of the focal power, the following known values concerning the dimensions of the amplifier PA(k) may be used:

Zin: Distance from the wavefront controller 50(k) to an entrance end of the pair of electrodes 71 and 72.

Din: Distance between the electrodes 71 and 72 at the entrance end.

Zout: Distance from the wavefront controller 50(k) to an exit end of the pair of electrodes 71 and 72.

Dout: Distance between the electrodes 71 and 72 at the exit end.

These known values may be stored in the after-mentioned storage memory.

FIG. 5 shows Zin, Din, Zout, and Dout, as well as the above-described Win and Rin.

Assuming the first position is a position where Z=Zin, it is desirable that the beam diameter at the first position be smaller than Din. Assuming the second position is a position where Z=Zout, it is desirable that the beam diameter at the second position be smaller than Dout.

In FIG. 5, furthermore, the following parameters may be defined:

Zw: Distance from the wavefront controller 50(k) to the beam waist of the pulse laser beam. This distance Zw may vary depending on the focal power of the wavefront controller 50(k), the beam characteristics of the pulse laser beam, and the like.

$W_0$: Radius of the beam waist of the pulse laser beam. The radius $W_0$ of the beam waist may vary depending on the focal power of the wavefront controller 50(k), the beam characteristics of the pulse laser beam, and the like.

Zt: Position vector of a given position along the beam axis of the pulse laser beam from the position of the beam waist of the pulse laser beam outputted from the wavefront controller 50(k). Zt is positive in the travel direction of the pulse laser beam. The distance from the wavefront controller 50(k) to the beam waist is Zw, which is expressed in Zt=Z−Zw. For example, the wavefront controller 50(k) may be said to be at a position where Z=0, i.e., a position where Zt=−Zw.

W(Zt): Beam radius of the pulse laser beam at the given position Zt.

R(Zt): Curvature radius of the wavefront of the pulse laser beam at the given position Zt.

In general, the beam radius W(Zt) and the curvature radius R(Zt) of the wavefront are expressed in the following expressions:

$$W(Zt) = W_0 \left[ 1 + \left( \frac{-ZtM^2\lambda}{\pi W_0^2} \right)^2 \right]^{1/2} \quad \text{Expression 1}$$

$$R(Zt) = -Zt \left[ 1 + \left( \frac{\pi W_0^2}{-ZtM^2\lambda} \right)^2 \right] \quad \text{Expression 2}$$

In these expressions, $\lambda$ may be the wavelength of the pulse laser beam. The beam intensity distribution of the pulse laser beam may be a Gaussian distribution. $\lambda$ may be stored in the after-mentioned storage memory.

The processor 60(k) may transmit a control signal to the wavefront controller 50(k) so that the focal power of the wavefront controller 50(k) takes on the target value Pwt thus calculated.

Figure 7:
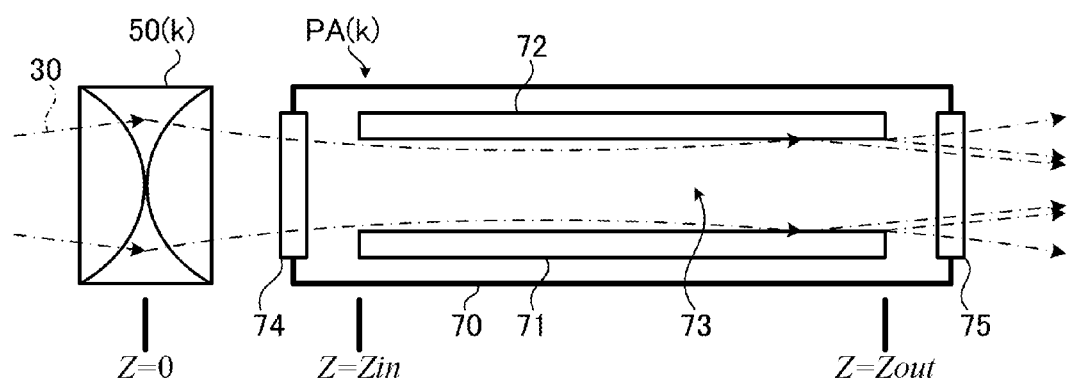
FIG. 7 shows an example of a beam path in the amplifier prior to transmission of a control signal to the wavefront controller.

FIG. 7 shows an example of a beam path in the amplifier PA(k) prior to transmission of a control signal to the wavefront controller 50(k). As shown in FIG. 7, a part of the pulse laser beam 30 incident on the amplifier PA(k) may strike the vicinity of the exit end of the pair of electrodes 71 and 72. Such a part of the pulse laser beam 30 may be reflected by the pair of electrodes 71 and 72 to complicate the beam profile. The processor 60(k) may transmit a control signal to the wavefront controller 50(k) so that the beam diameter at the position where Z=Zin is smaller than Din and the beam diameter at the position where Z=Zout is smaller than Dout.

3.3 Operation 3.3.1 Main Flow

Figure 8:
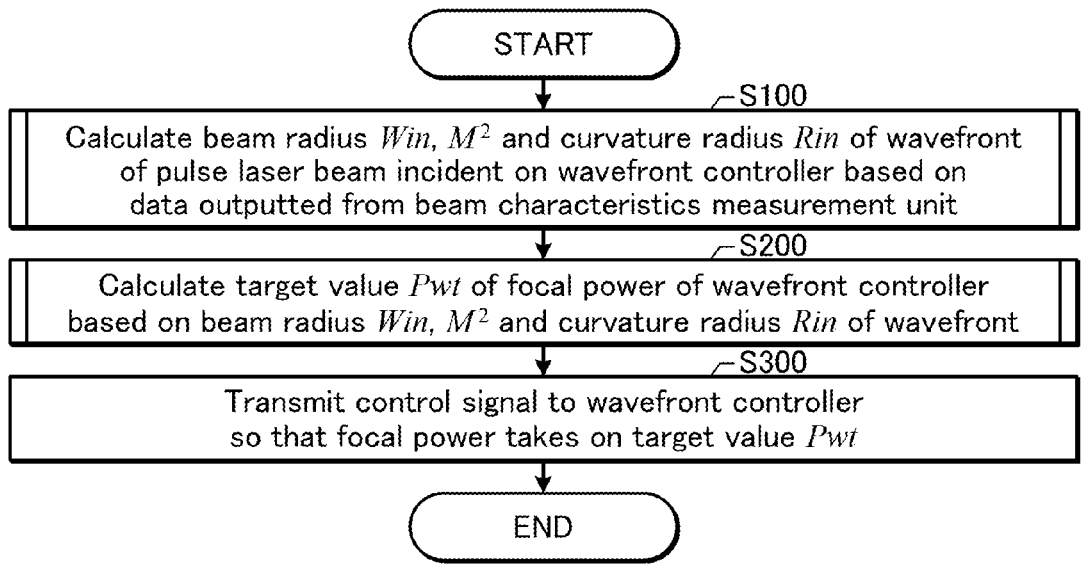
FIG. 8 is a flowchart showing an exemplary operation of the processor shown in FIG. 3.

FIG. 8 is a flowchart showing an exemplary operation of the processor 60(k) shown in FIG. 3. The processor 60(k) may control the wavefront controller 50(k) through the following process. The process shown in FIG. 8 may be executed at regular time intervals during operation of the EUV light generation system 11 (see FIG. 1).

First, in step S100, the processor 60(k) may calculate the beam radius Win and M square value $M^2$ of a pulse laser beam incident on the wavefront controller 50(k) and the curvature radius Rin of the wavefront of the pulse laser beam incident on the wavefront controller 50(k) on the basis of data outputted from the beam characteristics measurement unit 40(k). Details of this process will be described below with reference to FIGS. 9 to 12.

Next, in step S200, the processor 60(k) may calculate the target value Pwt of the focal power of the wavefront controller 50(k) on the basis of the beam radius Win and M square value $M^2$ of the pulse laser beam incident on the wavefront controller 50(k) and the curvature radius Rin of the wavefront of the pulse laser beam incident on the wavefront controller 50(k). Details of this process will be described below with reference to FIG. 13.

Next, in step S300, the processor 60(k) may transmit a control signal to the wavefront controller 50(k) so that the focal power takes on the target value Pwt.

Upon completion of the processing in step S300, the processor 60(k) may end the process of the present flowchart.

3.3.2 Calculation of Beam Characteristics

Figure 9:
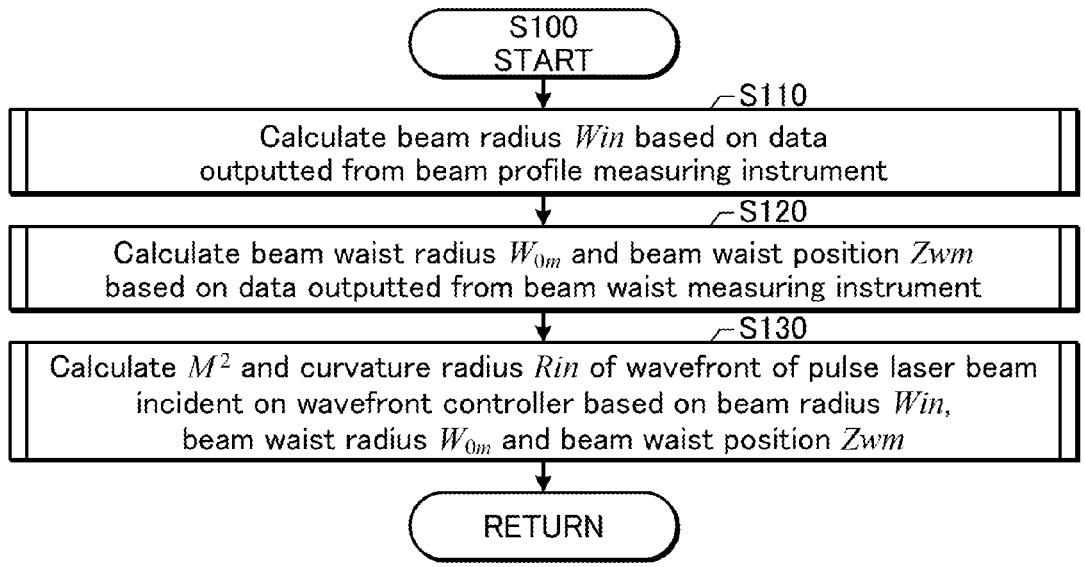
FIG. 9 is a flowchart showing details of a process in step S100 shown in FIG. 8.

FIG. 9 is a flowchart showing details of a process in step S100 shown in FIG. 8. The process shown in FIG. 9 may be performed by the processor 60(k) as a subroutine of step S100. The processor 60(k) may calculate Win, $M^2$, and Rin through the following process.

First, in step S110, the processor 60(k) may calculate the beam radius Win of the pulse laser beam incident on the wavefront controller 50(k) on the basis of data outputted from the beam profile measuring instrument 43. Details of this process will be described below with reference to FIG. 10.

Next, in step S120, the processor 60(k) may calculate the beam waist radius $W_{0m}$ and beam waist position Zwm on the basis of data outputted from the beam waist measuring instrument 46. Details of this process will be described below with reference to FIG. 11.

Next, in step S130, the processor (k) may calculate the M square value $M^2$ of the pulse laser beam incident on the wavefront controller 50(k) and the curvature radius Rin of the wavefront of the pulse laser beam incident on the wavefront controller 50(k) on the basis of the beam radius Win, the beam waist radius $W_{0m}$, and the beam waist position Zwm. Details of this process will be described below with reference to FIG. 12.

Upon completion of the processing in step S130, the processor 60(k) may end the process of the present flowchart and shift to step S200 shown in FIG. 8.

3.3.2.1 Calculation of Win

Figure 10:
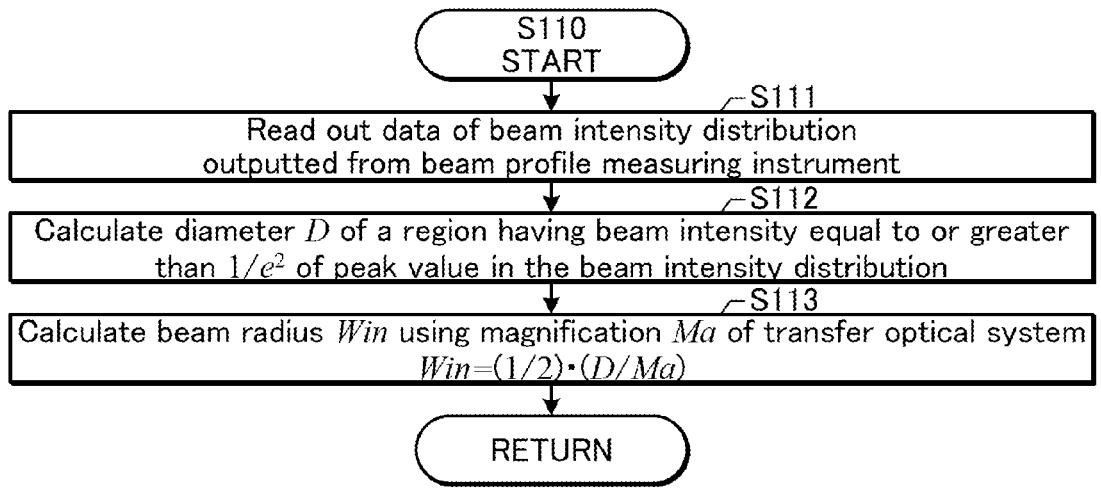
FIG. 10 is a flowchart showing details of a process in step S110 shown in FIG. 9.

FIG. 10 is a flowchart showing details of a process in step S110 shown in FIG. 9. The process shown in FIG. 10 may be performed by the processor 60(k) as a subroutine of step S110. The processor 60(k) may calculate the beam radius Win of the pulse laser beam incident on the wavefront controller 50(k) through the following process.

First, in step S111, the processor 60(k) may read out the data of the beam intensity distribution outputted from the beam profile measuring instrument 43.

Next, in step S112, the processor 60(k) may calculate the diameter D of a region having beam intensity equal to or greater than $1/e^2$ of the peak value in the beam intensity distribution thus read out. Note here that e may be a Napier's constant.

Next, in step S113, the processor 60(k) may calculate the beam radius Win using a magnification Ma of the transfer optical system 44. The beam radius Win may be calculated by the following expression:

$$Win = (1/2) \cdot (D/Ma)$$

This beam radius Win may be treated as being equal to the beam radius Win of the pulse laser beam incident on the wavefront controller 50(k).

Figure 11:
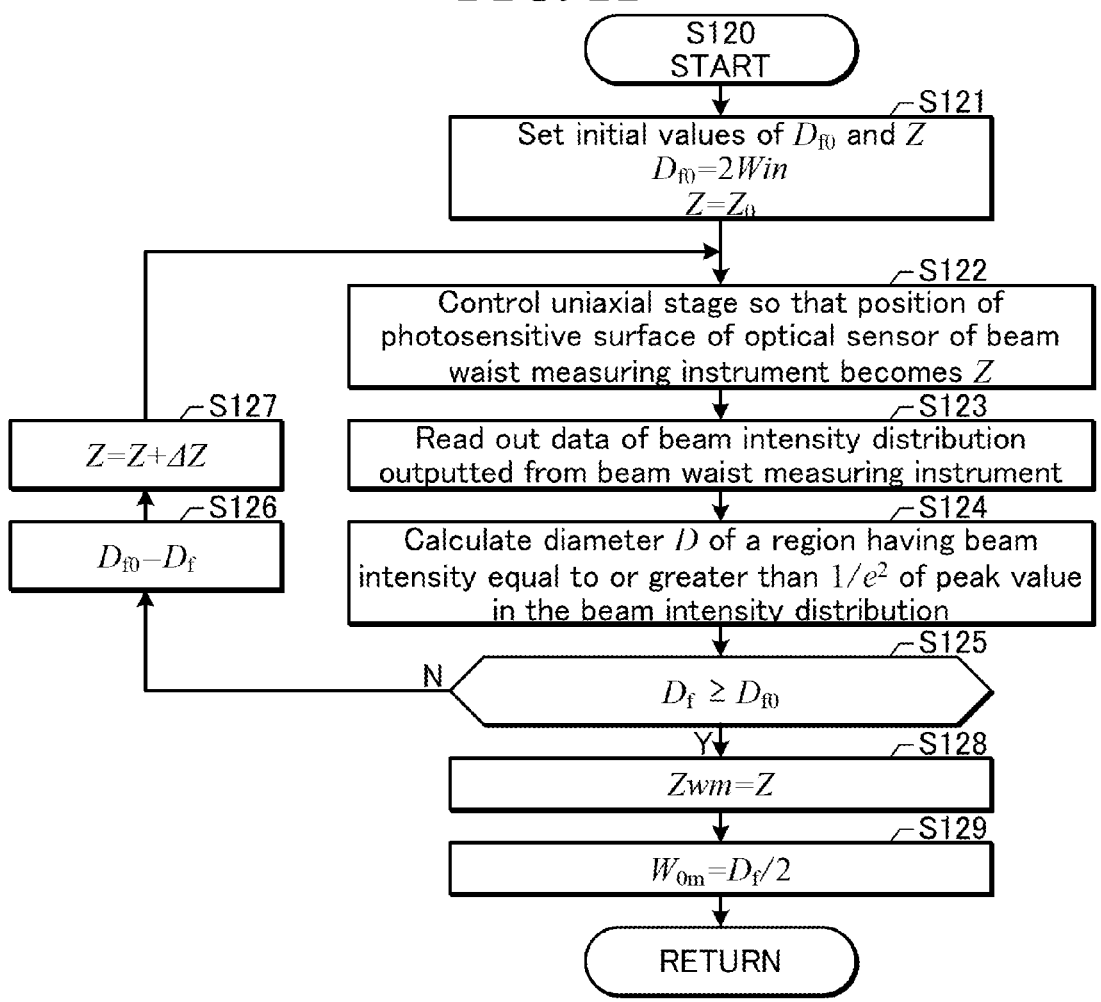
FIG. 11 is a flowchart showing details of a process in step S120 shown in FIG. 9.

Upon completion of the processing in step S113, the processor 60(k) may end the process of the present flowchart and shift to step S120 shown in FIGS. 9 and 11.

3.3.2.2 Calculation of $W_a$, and Zwm

FIG. 11 is a flowchart showing details of a process in step S120 shown in FIG. 9. The process shown in FIG. 11 may be performed by the processor 60(k) as a subroutine of step S120. The processor 60(k) may calculate the beam waist radius $W_{0m}$ and beam waist position Zwm of the pulse laser beam that is focused by the focusing optical system 47 through the following process (see FIG. 6).

First, in step S121, the processor 60(k) may set an initial value of a position Z of the photosensitive surface of the optical sensor 48 and an initial value of a beam diameter $D_{f0}$ on the photosensitive surface of the optical sensor 48 as follows, respectively:

$$Z = Z_0$$

$$D_{f0} = 2Win$$

Note here that $Z_0$ may be a distance from the position of the focusing optical system 47 to the photosensitive surface of the optical sensor 48 at the time when the optical sensor 48 has been brought closest to the focusing optical system 47 by the uniaxial stage 49.

Further, Win is the beam radius of the pulse laser beam incident on the focusing optical system 47, and as Win, the value of the beam radius Win of the pulse laser beam incident on the wavefront controller 50(k) as calculated by the process shown in FIG. 10 may be used.

Next, in step S122, the processor 60(k) may transmit a control signal to the uniaxial stage 49 so that the position of the photosensitive surface of the optical sensor 48 of the beam waist measuring instrument 46 becomes the set position Z.

Next, in step S123, the processor 60(k) may read out the data of the beam intensity distribution outputted from the optical sensor 48 of the beam waist measuring instrument 46.

Next, in step S124, the processor 60(k) may calculate the diameter $D_f$ of a region having beam intensity equal to or greater than $1/e^2$ of the peak value in the beam intensity distribution thus read out.

Next, in step S125, the processor 60(k) may compare the diameter $D_{f0}$ with the newly calculated diameter $D_f$. If the newly calculated diameter $D_f$ is smaller than the diameter $D_{f0}$ (S125; NO), the processor 60(k) may proceed to step S126.

In step S126, the processor 60(k) may update the value of the diameter $D_{f0}$ to the value of the newly calculated diameter $D_f$.

Next, in step S127, the processor 60(k) may update the position Z of the photosensitive surface of the optical sensor 48 by adding a positive number ΔZ to the value of S.

After step S127, the processor 60(k) may return to the above-described step S122 and repeat the processing from 8122 to 8125.

If, in step S125, the newly calculated diameter $D_f$ is equal to or greater than the diameter $D_{f0}$ (S125; YES), it can be deemed that the beam diameter on the photosensitive surface of the optical sensor 48 has reached the local minimal value. Then, the processor 60(k) may proceed to step S128.

In step S128, the processor 60(k) may store the value of the position Z of the photosensitive surface of the optical sensor 48 as the beam waist position Zwm in the after-mentioned memory.

Next, in step S129, the processor 60(k) may store half the value of the newly calculated diameter $D_f$ as the beam waist radius $W_{0m}$ in the after-mentioned memory.

Figure 12:
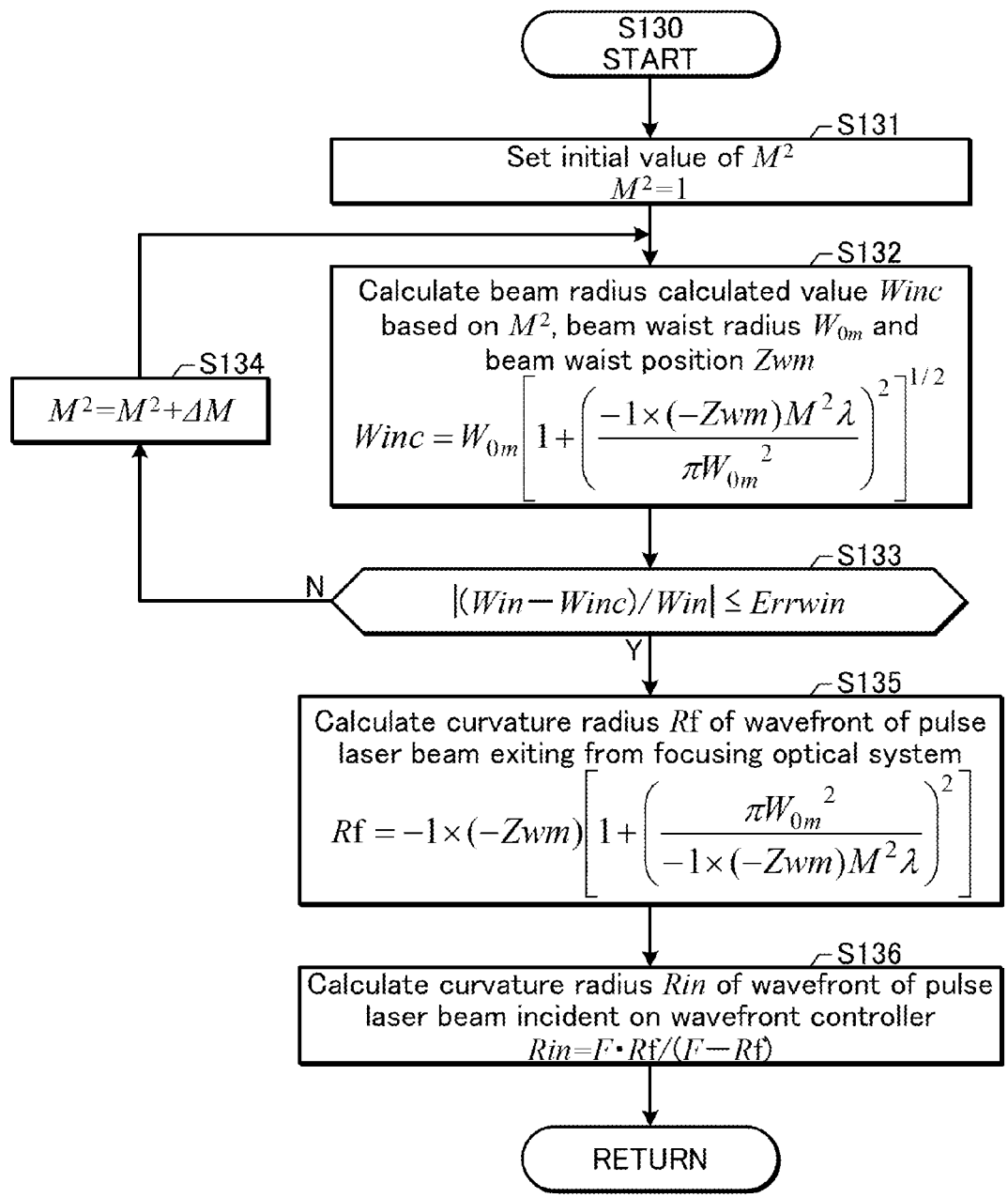
FIG. 12 is a flowchart showing details of a process in step S130 shown in FIG. 9.

Upon completion of the processing in step S129, the processor 60(k) may end the process of the present flowchart and shift to step S130 shown in FIGS. 9 and 12.

It is possible to, without being limited to the process method of the present flowchart, measure beam diameters $D_f$ at multiple positions Z and, on the basis of these values of Z and $D_f$, derive an approximate curve that indicates a relationship between Z and $D_f$. It is possible to calculate the beam waist radius $W_{0m}$ and the beam waist position Zwm by obtaining the local minimal value of $D_f$ and Z at which $D_f$ takes on the local minimal value.

3.3.2.3 Calculation of $M^2$ and Rin

FIG. 12 is a flowchart showing details of a process in step S130 shown in FIG. 9. The process shown in FIG. 12 may be performed by the processor 60(k) as a subroutine of step S130. The processor 60(k) may calculate the M square value $M^2$ of the pulse laser beam incident on the wavefront controller 50(k) and the curvature radius Rin of the wavefront of the pulse laser beam incident on the wavefront controller 50(k) through the following process.

First, in step S131, the processor 60(k) may set an initial value of the M square value $M^2$ of the pulse laser beam incident on the focusing optical system 47 to 1.

Next, in step S132, the processor 60(k) may calculate the beam radius calculated value Winc of the pulse laser beam incident on the focusing optical system 47 from the M square value $M^2$, the beam waist radius $W_{0m}$, and the beam waist position Zwm. In Expression 1 above, Zt may be a position vector, based on the beam waist position, which is positive in the travel direction of the pulse laser beam. Since the beam waist position is Z=Zwm and the position of the focusing optical system 47 is Z=0, the position of the focusing optical system 47 based on the beam waist position may be Zt=−Zwm. Therefore, in Expression 1 above, the value of −Zwm may be substituted in Zt. In $W_0$ in Expression 1 above, the beam waist radius $W_{0m}$ may be substituted. The beam radius calculated value Winc of the pulse laser beam incident on the focusing optical system 47 may be calculated as follows:

$$Winc = W_{0m}\left[1 + \left(\frac{-1\times(-Zwm)M^2\lambda}{\pi w_{0m}^2}\right)^2\right]^{1/2} \quad \text{Expression 3}$$

Next, in step S133, the processor 60(k) may determine whether a difference between the beam radius calculated value Winc and the beam radius Win of the pulse laser beam incident on the focusing optical system 47 falls within an allowable range. For example, the processor 60(k) may determine whether the following condition is satisfied:

|(Win−Winc)/Win|≤Errwin

Note here that Errwin may be a value that is set as an allowed value of an error. As the beam radius Win of the pulse laser beam incident on the focusing optical system 47, the beam radius Win calculated by the process shown in FIG. 10 may be used.

If the difference between Winc and Win does not fall within the allowable range (S133; NO), it may be said the value set as the M square value $M^2$ was not appropriate. Therefore, in step S134, the processor 60(k) may update the value of $M^2$ by adding a positive number ΔM to the value of $M^2$. After step S134, the processor 60(k) may return to step S132 and repeat the processing from 8132 to 8133.

If the difference between Winc and Win falls within the allowable range (S133; YES), it may be deemed that the value set as the M square value $M^2$ was appropriate. Therefore, the processor 60(k) may proceed to step S135. At this point in time, the M square value $M^2$ of the pulse laser beam incident on the focusing optical system 47 may be stored in the after-mentioned memory. The M square value $M^2$ of the pulse laser beam incident on the focusing optical system 47 may be treated as being equal to the N square value $M^2$ of the pulse laser beam incident on the wavefront controller 50(k).

In step S135, the processor 60(k) may calculate the curvature radius Rf of the wavefront of a pulse laser beam exiting from the focusing optical system 47. In Expression 2 above, St may be a position vector, based on the beam waist position, which is positive in the travel direction of the pulse laser beam. Since the beam waist position is Z=Zwm and the position of the focusing optical system 47 is Z=0, the position of the focusing optical system 47 based on the beam waist position may be Zt=−Zwm. Therefore, in Expression 2 above, the value of −Zwm may be substituted in St. In $W_0$ in Expression 2 above, the beam waist radius $W_{0m}$ may be substituted. The curvature radius Rf of the wavefront of the pulse laser beam exiting from the focusing optical system 47 may be calculated as follows:

$$Rf = -1\times(-Zwm)\left[1 + \left(\frac{\pi w_{0m}^2}{-1\times(-Zwm)M^2\lambda}\right)^2\right] \quad \text{Expression 4}$$

Next, in step S136, the processor 60(k) may calculate the curvature radius Rin of the wavefront of the pulse laser beam incident on the focusing optical system 47. Since the curvature radius of the wavefront of the pulse laser beam exiting from the focusing optical system 47 is Rf, the focal power Pw of the focusing optical system 47 is expressed as follows:

Pw=1/F=1/Rf−1/Rin

Therefore, the curvature radius Rin of the wavefront of the pulse laser beam incident on the focusing optical system 47 may be obtained as follows:

Rin=F·Rf/(F−Rf)

This curvature radius Rin may be treated as being equal to the curvature radius Rin of the wavefront of the pulse laser beam incident on the wavefront controller 50(k).

Figure 13:
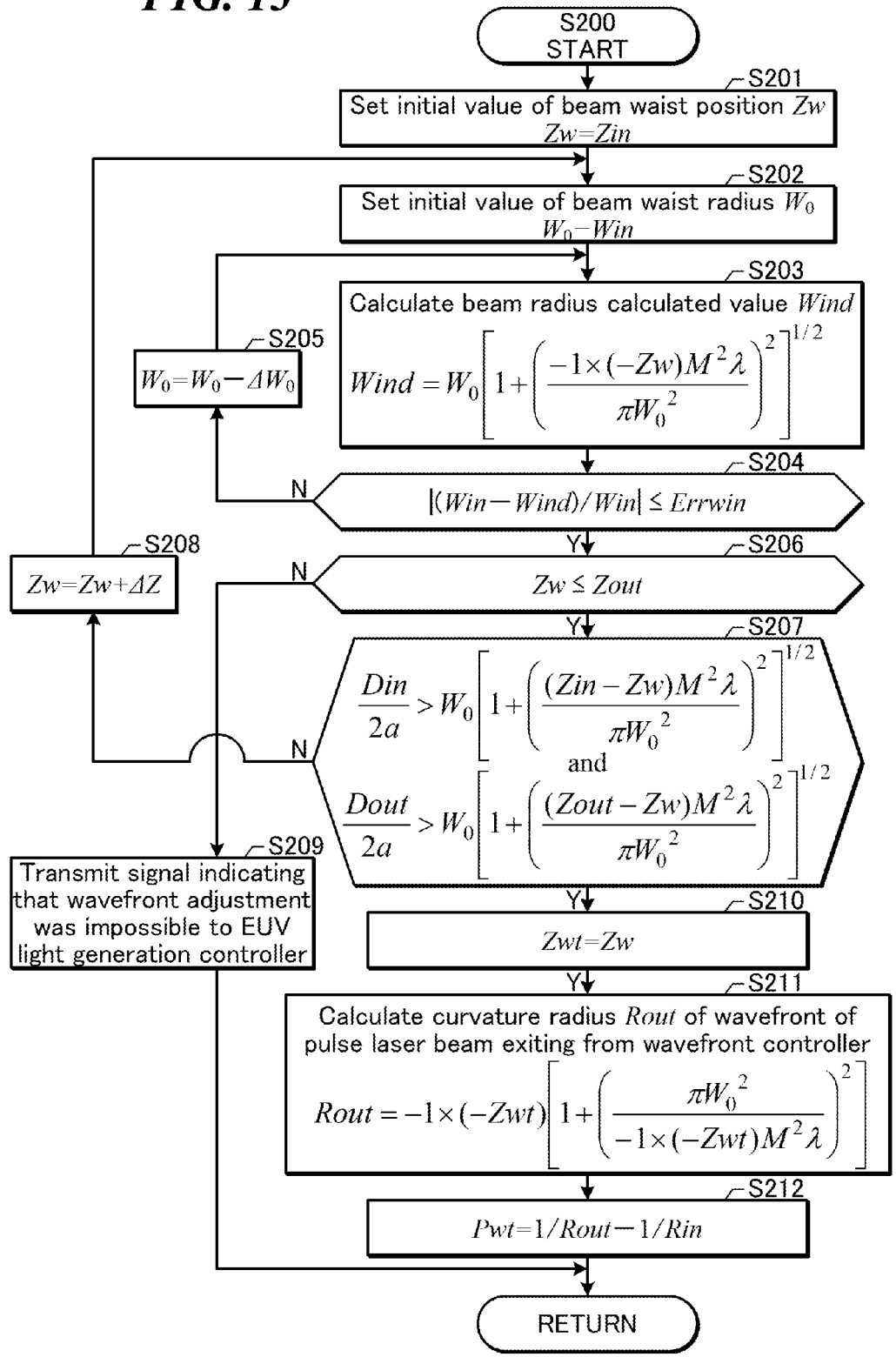
FIG. 13 is a flowchart showing details of a process in step S200 shown in FIG. 8.

Upon completion of the processing in step S136, the processor 60(k) may end the process of the present flowchart and shift to step S200 shown in FIGS. 8 and 13.

3.3.3 Calculation of Target Value of Focal Power

FIG. 13 is a flowchart showing details of a process in step S200 shown in FIG. 8. The process shown in FIG. 13 may be performed by the processor 60(k) as a subroutine of step S200. The processor 60(k) may calculate the target value Pwt of the focal power of the wavefront controller 50(k) through the following process.

First, in step S201, the processor 60(k) may set an initial value of the beam waist position Zw of a pulse laser beam outputted from the wavefront controller 50(k) to Zin. Zin may be a distance from the wavefront controller 50(k) to the entrance end of the pair of electrodes 71 and 72 (see FIG. 5).

Next, in step S202, the processor 60(k) may set an initial value of the beam waist radius $W_0$ of the pulse laser beam outputted from the wavefront controller 50(k) to Win. Win may be the beam radius of the pulse laser beam incident on the wavefront controller 50(k).

Next, in step S203, the processor 60(k) may calculate the beam radius calculated value Wind of the pulse laser beam incident on the wavefront controller 50(k). In Expression 1 above, Zt may be a position vector, based on the beam waist position, which is positive in the travel direction of the pulse laser beam. Since the beam waist position is Z=Zw and the position of the wavefront controller 50(k) is Z=0, the position of the wavefront controller 50(k) based on the beam waist position may be Zt=−Zw. Therefore, in Expression 1 above, −Zw may be substituted in Zt. The beam radius calculated value Wind of the pulse laser beam incident on the wavefront controller 50(k) may be calculated as follows:

$$Wind = W_0\left[1 + \left(\frac{-1 \times (-Zw)M^2\lambda}{\pi W_0^2}\right)^2\right]^{1/2} \quad \text{Expression 5}$$

Next, in step S204, the processor 60(k) may determine whether a difference between the beam radius calculated value Wind and the beam radius Win of the pulse laser beam incident on the wavefront controller 50(k) falls within an allowable range. For example, the processor 60(k) may determine whether the following condition is satisfied:

|(Win−Wind)/Win|≤Errwin

Note here that Errwin may be a value that is set as an allowed value of an error. As the beam radius Win of the pulse laser beam incident on the wavefront controller 50(k), the beam radius Win calculated by the process shown in FIG. 10 may be used.

If the difference between Wind and Win does not fall within the allowable range (S204; NO), it may be said the value set as the value of the beam waist radius $W_0$ was not appropriate under the set beam waist position Zw. Therefore, in step S205, the processor 60(k) may update the value of $W_0$ by subtracting a positive number $\Delta W_0$ from the value of $W_0$. After step S205, the processor 60(k) may return to step S203 and repeat the processing from S203 to S204.

If the difference between Wind and Win falls within the allowable range (S204; YES), it may be deemed that the value of the set beam waist radius $W_0$ was appropriate under the set beam waist position Zw. Therefore, the processor 60(k) may proceed to step S206.

In step S206, the processor 60(k) may determine whether the set beam waist position Zw is equal to or smaller than Zout. Zout may be a distance from the wavefront controller 50(k) to the exit end of the pair of electrodes 71 and 72 (see FIG. 5). If the set beam waist position Zw is equal to or smaller than Zout (S206; YES), the processor 60(k) may proceed to step S207.

In step S207, the processor 60(k) may compare the beam diameters at the positions of Zin and Zout with the respective thresholds. In Expression 1 above, Zt may be a position vector, based on the beam waist position, which is positive in the travel direction of the pulse laser beam. Since the beam waist position is Z=Zw, the position of Zin based on the beam waist position may be Zt=Zin−Zw. Therefore, in Expression 1, (Zin−Zw) may be substituted in Zt. It is desirable that the beam radius at the position of Sin thus calculated be smaller than Din/2a, where Din is the distance between the electrodes 71 and 72 at the entrance end. Therefore, the following condition may be determined:

$$\frac{Din}{2a} > W_0\left[1 + \left(\frac{(Zin - Zw)M^2\lambda}{\pi W_0^2}\right)^2\right]^{1/2} \quad \text{Expression 6}$$

Further, the position of Zout based on the beam waist position may be Zt=Zout−Zw. Therefore, in Expression 1, (Zout−Zw) may be substituted in Zt. It is desirable that the beam radius at the position of Zout thus calculated be smaller than Dout/2a, where Dout is the distance between the electrodes 71 and 72 at the exit end. Therefore, the following condition may be determined:

$$\frac{Dout}{2a} > W_0\left[1 + \left(\frac{(Zout - Zw)M^2\lambda}{\pi W_0^2}\right)^2\right]^{1/2} \quad \text{Expression 7}$$

Note here that a may be a constant of not smaller than 1 to not greater than 3, preferably not smaller than 1.5 to not greater than 1.9, more preferably not smaller than 1.6 to not greater than 1.8. In a case where a is not smaller than 1, the pair of electrodes 71 and 72 may be prevented from being struck by a region having beam intensity equal to or greater than $1/e^2$ of the peak value in a beam intensity distribution of the pulse laser beam.

If either Expression 6 or Expression 7 is not satisfied (S207; NO), it may be said that the value of the beam waist position Zw was not appropriate. Therefore, in step S208, the processor 60(k) may update the value of Zw by adding the positive number ΔZ to the value of Zw. After step S208, the processor 60(k) may return to step S202 and repeat the processing from S202 to S207.

If both Expression 6 and Expression 7 are satisfied (S207; YES), it may be deemed that the value of the beam waist position Zw was appropriate. Therefore, the processor 60(k) may proceed to step S210.

If, in the above-described step S206, the set beam waist position Zw is not equal to or smaller than Zout (S206; NO), the condition for step S207 described above may not be satisfied even with a change in the beam waist position Zw from Zin to Zout. Therefore, the processor 60(k) may proceed to step S209.

In step S209, the processor 60(k) may transmit, to the EUV light generation controller 5, a signal indicating that wavefront adjustment was impossible, and may end the process of the present flowchart.

In step S210, the processor 60(k) may store the value of the set beam waist position Zw as the target beam waist position Zwt in the after-mentioned memory.

Next, in step S211, the processor 60(k) may calculate the curvature radius Rout of the wavefront of a pulse laser beam exiting from the wavefront controller 50(k). In Expression 2 above, Et may be a position vector, based on the beam waist position, which is positive in the travel direction of the pulse laser beam. Since the beam waist position is Z=Zwt and the position of the wavefront controller 50(k) is Z=0, the position of the wavefront controller 50(k) based on the beam waist position may be Zt=−Zwt. Therefore, in Expression 2 above, the value of −Zwt may be substituted in Zt. The curvature radius Rout of the wavefront of the pulse laser beam exiting from the wavefront controller 50(k) may be calculated as follows:

$$Rout = -1 \times (-Zwt)\left[1 + \left(\frac{\pi W_0^2}{-1 \times (-Zwt)M^2\lambda}\right)^2\right] \quad \text{Expression 8}$$

Next, in step S212, the processor 60(k) may calculate the target value Pwt of the focal power of the wavefront controller 50(k) through the following expression:

Pwt=1/Rout−1/Rin

Upon completion of the processing in step S212, the processor 60(k) may end the process of the present flowchart and shift to step S300 shown in FIG. 8.

In this way, the target value Pwt of the focal power of the wavefront controller 50(k) may be calculated, and a control signal may be transmitted to the wavefront controller 50(k).

3.4 Others

The foregoing description assumes that the positions of the entrance end and exit end of the pair of electrodes 71 and 72 are the first and second positions, respectively. However, the present disclosure is not limited to this assumption. In a case where a plurality of apertures that allow passage of a pulse laser beam are provided inside an amplifier, the positions of these apertures may be the first and second positions.

The foregoing description has discussed a case where the distance L1 and the distance L2 are substantially equal and the distance L1 and the distance L3 are substantially equal. However, the present disclosure is not limited to this case. For example, a correction calculation based on the difference between the distance L1 and the distance L2 or L3 may be possible, provided the distance L2 and the distance L3 are substantially equal and the beam radius and the curvature radius of the wavefront at a specific position on the beam path of a pulse laser beam can be calculated. Further, for example, the curvature radius of the wavefront can be correctively calculated on the basis of the difference between the distance L1 and the distance L3, provided the distance L1 and the distance L2 are substantially equal and the beam radius Win of the pulse laser beam incident on the wavefront controller 50(k) can be calculated.

4. LASER APPARATUS THAT PERFORMS BEAM DIAMETER CONTROL (SECOND EMBODIMENT)

4.1 Configuration

Figure 14:
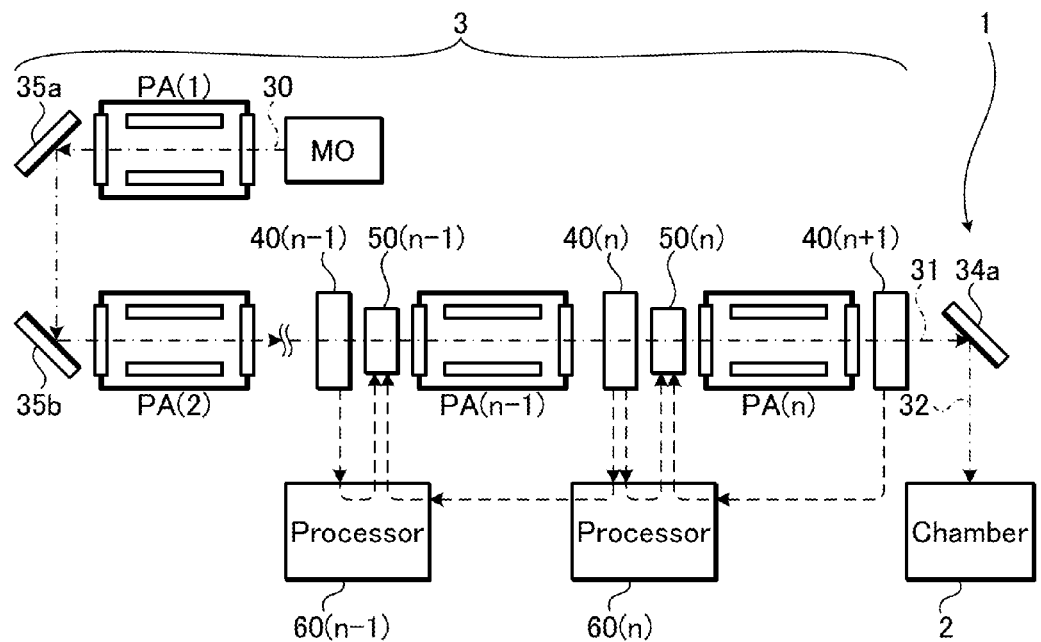
FIG. 14 is a partial sectional view illustrating a configuration of a laser apparatus according to a second embodiment of the present disclosure.

FIG. 14 is a partial sectional view illustrating a configuration of a laser apparatus 3 according to a second embodiment of the present disclosure. FIG. 14 illustrates a beam characteristics measurement unit 40(n−1), a wavefront controller 50(n−1), a processor 60(n−1), and an amplifier PA(n−1) as examples of the beam characteristics measurement unit 40(k), the wavefront controller 50(k), the processor 60(k), and the amplifier PA(k). The second embodiment is the same as the first embodiment in that the processor 60(n−1) controls the wavefront controller 50(n−1) on the basis of data outputted from the beam characteristics measurement unit 40(n−1). In the second embodiment, furthermore, the processor 60(n−1) may be configured to control the wavefront controller 50(n−1) on the basis of data outputted from a beam characteristics measurement unit 40(n) on a downstream side of the amplifier PA(n−1). That is, the data outputted from the beam characteristics measurement unit 40(n) may be not only used for controlling the wavefront controller 50(n) but also used for controlling the upstream wavefront controller 50(n−1). On a downstream side of the amplifier PA(n), a beam characteristics measurement unit 40(n+1) may be further provided.

Figure 15:
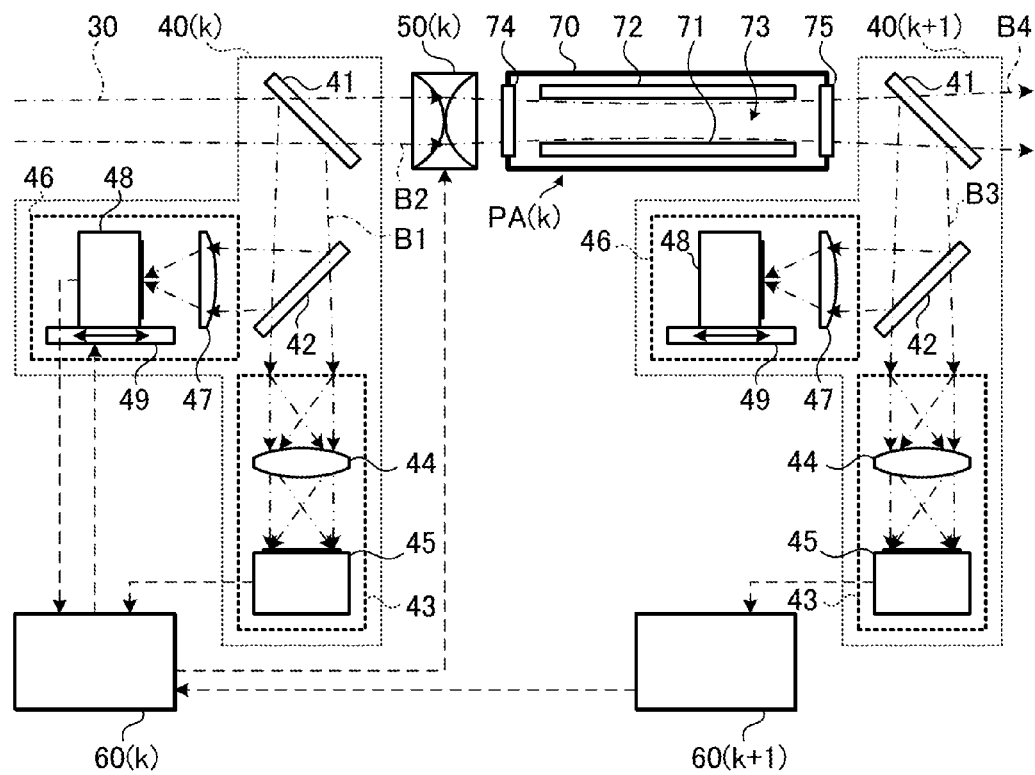
FIG. 15 is an enlarged view of a downstream beam characteristics measurement unit and a processor, as well as one amplifier, one wavefront controller, one beam characteristics measurement unit, and one processor that are shown in FIG. 14.

FIG. 15 is an enlarged view of a part of the laser apparatus 3 according to the second embodiment of the present disclosure. The beam characteristics measurement unit 40(k), the wavefront controller 50(k), the processor 60(k), and the amplifier PA(k) in FIG. 15 may correspond to the beam characteristics measurement unit 40(n−1), the wavefront controller 50(n−1), the processor 60(n−1), and the amplifier PA(n−1) in FIG. 14. The beam characteristics measurement unit 40(k+1) and the processor 60(k+1) in FIG. 15 may correspond to the beam characteristics measurement unit 40(n) and the processor 60(n) in FIG. 14.

In FIG. 15, the beam characteristics measurement unit 40(k), the wavefront controller 50(k), and the amplifier PA(k) may be identical in configuration and function to those of the first embodiment.

As shown in FIG. 15, the beam splitter 41 of the beam characteristics measurement unit 40(k+1) may split the pulse laser beam 30 into a third beam path B3 and a fourth beam path B4. The beam splitter 41 of the beam characteristics measurement unit 40(k+1) may correspond to the second beam splitter of the present disclosure. The transfer optical system 44 and the optical sensor 45 may be provided in the third beam path B3. The optical sensor 45 of the beam characteristics measurement unit 40(k+1) may correspond to the second optical sensor of the present disclosure. The downstream wavefront controller 50(k+1) (not shown) may be provided in the fourth beam path B4.

The processor 60(k+1) may transfer, to the processor 60(k), data that is outputted from the beam profile measuring instrument 43 of the beam characteristics measurement unit 40(k+1). The processor 60(k) may control the wavefront controller 50(k) on the basis of this data.

Data that is outputted from the beam waist measuring instrument 46 of the beam characteristics measurement unit 40(k+1) may be used for controlling the downstream wavefront controller 50(k+1) (not shown), but does not need to be used for controlling the upstream wavefront controller 50(k).

4.2 Operation 4.2.1 Main Flow

Figure 16:
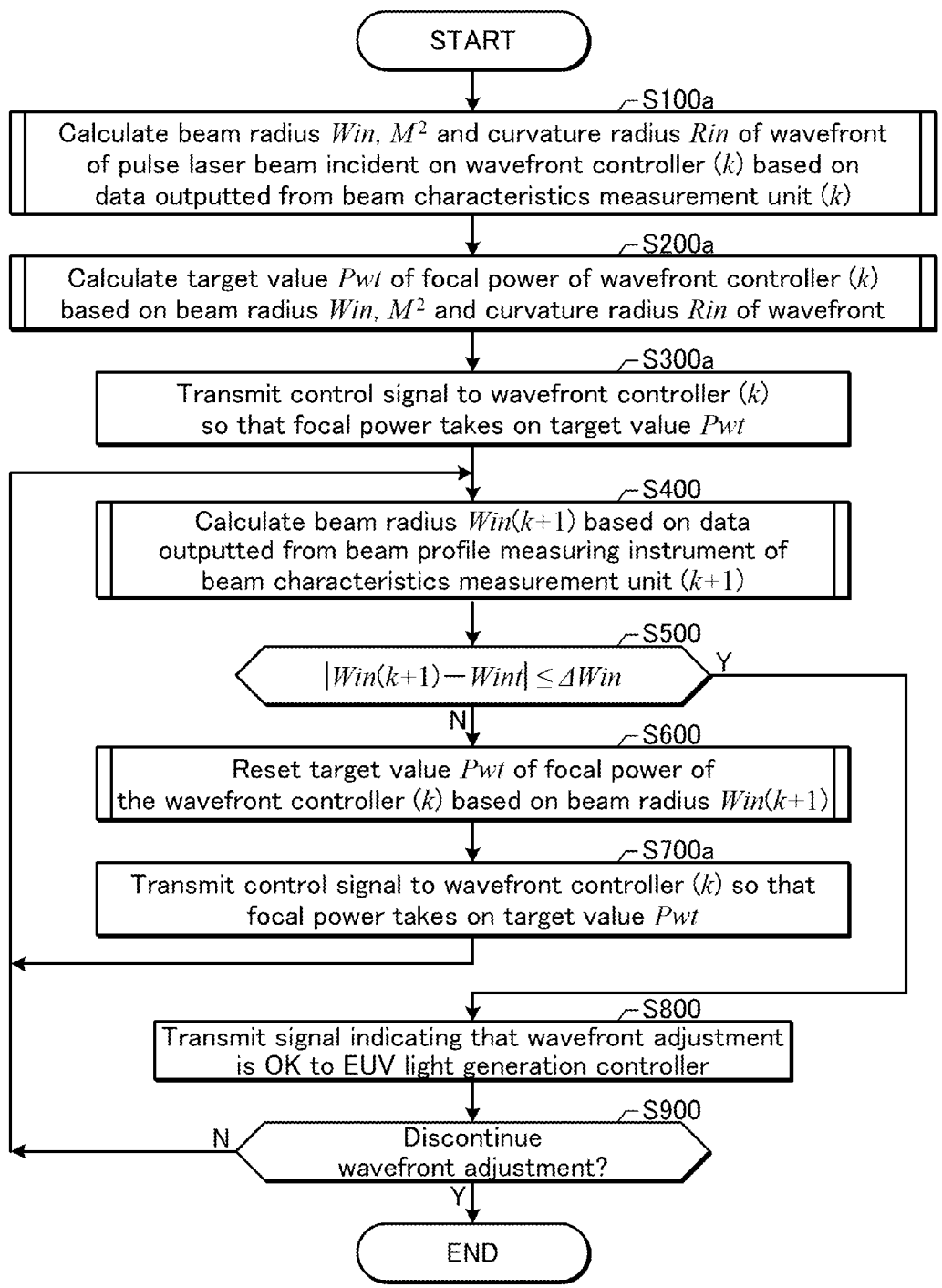
FIG. 16 is a flowchart showing an exemplary operation of a processor shown in FIG. 15.

FIG. 16 is a flowchart showing an exemplary operation of the processor 60(k) shown in FIG. 15. The processor 60(k) may control the wavefront controller 50(k) through the following process.

Steps S100a to S300a of the process shown in FIG. 16 may be the same as those of the first embodiment described with reference to FIG. 8. A control signal that the processor 60(k) transmits in step S300a may correspond to the first control signal of the present disclosure. After step S300a, the processor 60(k) may proceed to step S400.

In step S400, the processor 60(k) may calculate a beam radius Win(k+1) on the basis of data of a beam intensity distribution outputted from the beam profile measuring instrument 43 of the beam characteristics measurement unit 40(k+1). The beam radius Win(k+1) may be the beam radius of a pulse laser beam incident on the downstream wavefront controller 50(k+1). Details of this process will be described below with reference to FIG. 17.

Next, in step S500, the processor 60(k) may determine whether the absolute value of a difference between the beam radius Win(k+1) and a target beam radius Wint is equal to or smaller than a predetermined threshold ΔWin. If the condition is not satisfied in step S500 (S500; NO), the processor may proceed to step S600.

In step S600, the processor 60(k) may reset the target value Pwt of the focal power of the wavefront controller 50(k) on the basis of the beam radius Win (k+1). In step S600, the target value Pwt of the focal power may be set so that the beam radius Win(k+1) becomes closer to the target beam radius Wint. Details of this process will be described below with reference to FIG. 18.

Next, in step S700a, the processor 60(k) may transmit a control signal to the wavefront controller 50(k) so that the focal power takes on the target value Pwt. The processing in step S700a may be the same as the processing in step S300a, except that the target value Pwt of the focal power is reset.

A control signal that the processor 60(k) transmits in step S700a may correspond to the second control signal of the present disclosure.

After step S700a, the processor 60(k) may return to the above-described step S400 and repeat the processing from step S400 to step S500.

If the condition is satisfied in the above-described step S500 (S500; YES), the processor may proceed to step S800.

In step S800, the processor 60(k) may transmit, to the EUV light generation controller 5, a signal indicating that wavefront adjustment is OK.

Next, in step S900, the processor 60(k) may determine whether to discontinue the wavefront adjustment. In a case where the processor 60(k) does not discontinue the wavefront adjustment (S900; NO), the processor 60(k) may return to the above-described step S400 and repeat the processing from step S400 to step S900. Alternatively, the processor 60(k) may return to the above-described step S100a. In a case where the processor 60(k) discontinues the wavefront adjustment (S900; YES), the processor 60(k) may end the process of the present flowchart.

4.2.2 Calculation of Win(k+1)

Figure 17:
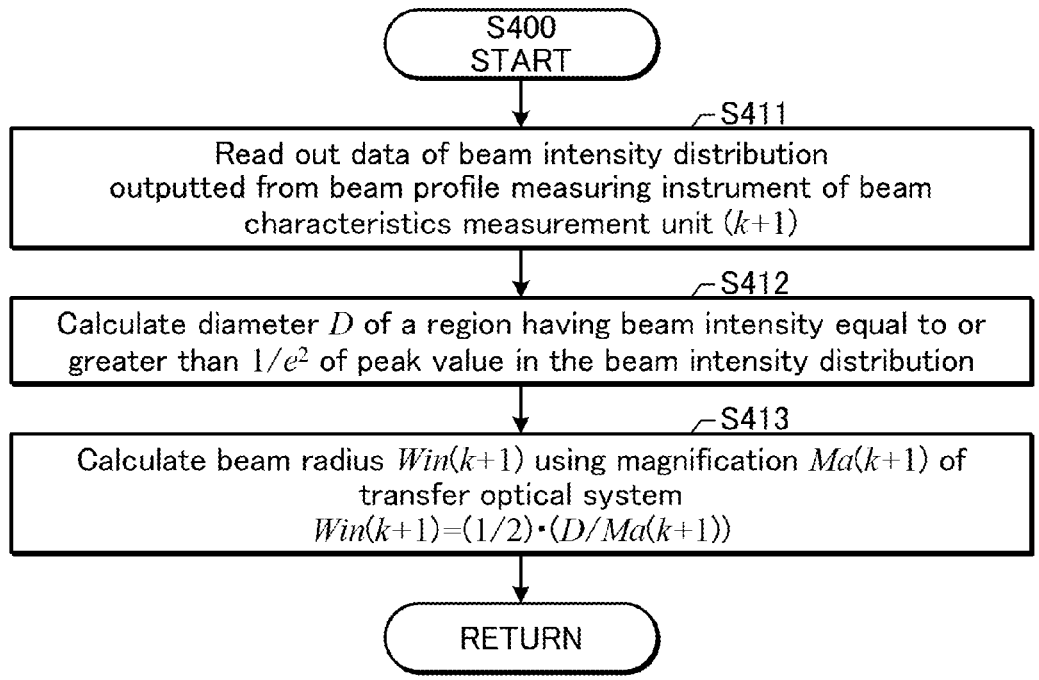
FIG. 17 is a flowchart showing details of a process in step S400 shown in FIG. 16.

FIG. 17 is a flowchart showing details of a process in step S400 shown in FIG. 16. The process shown in FIG. 17 may be performed by the processor 60(k) as a subroutine of step S400. In this process, the processor 60(k) may calculate the beam radius Win(k+1) of the pulse laser beam incident on the wavefront controller 50(k+1).

The process shown in FIG. 17 may be different from the process described with reference to FIG. 10 with regard to the first embodiment in that data of a beam intensity distribution outputted from the beam profile measuring instrument 43 of the beam characteristics measurement unit 40(k+1) is used. Further, the process shown in FIG. 17 may be different from the process described with reference to FIG. 10 with regard to the first embodiment in that a magnification Ma(k+1) of the transfer optical system 44 of the beam characteristics measurement unit 40(k+1) is used. In other respects, the process shown in FIG. 17 may be the same as the process described with reference to FIG. 10.

4.2.3 Setting of Target Value of Focal Power

Figure 18:
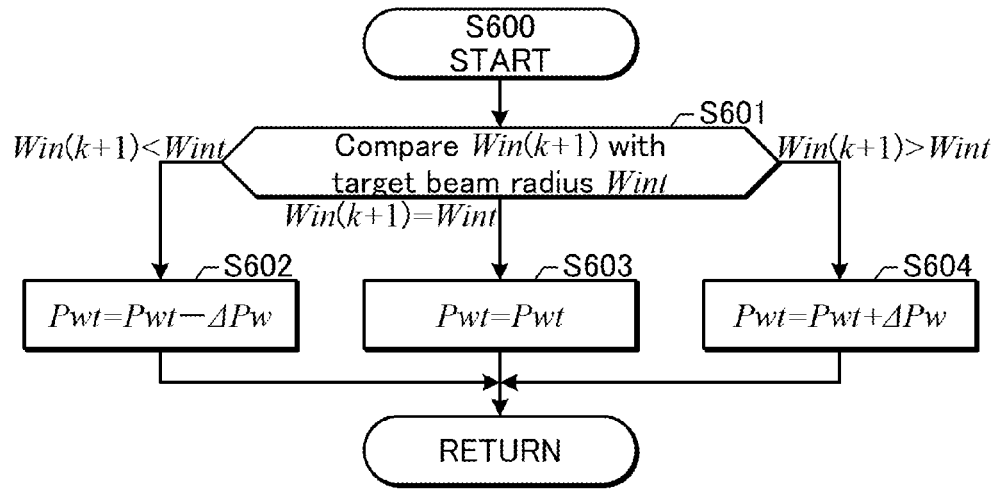
FIG. 18 is a flowchart showing details of a process in step S600 shown in FIG. 16.

FIG. 18 is a flowchart showing details of a process in step S600 shown in FIG. 16. The process shown in FIG. 18 may be performed by the processor 60(k) as a subroutine of step S600. The processor 60(k) may reset the target value Pwt of the focal power through the following process.

First, in step S601, the processor 60(k) may compare the beam radius Win(k+1) with the target beam radius Wint.

If the beam radius Win(k+1) is smaller than the target beam radius Wint, the processor 60(k) may proceed to step S602, in which the processor 60(k) may subtract a predetermined value ΔPw from the current target value Pwt and set the resulting value as a new target value Pwt of the focal power.

If the beam radius Win(k+1) is equal to the target beam radius Wint, the processor 60(k) may proceed to step S603, in which the processor 60(k) may set the current target value Pwt as a new target value Pwt of the focal power without change.

If the beam radius Win(k+1) is greater than the target beam radius Wint, the processor 60(k) may proceed to step S604, in which the processor 60(k) may add the predetermined value ΔPw to the current target value Pwt and set the resulting value as a new target value Pwt of the focal power.

Upon setting the new target value Pwt of the focal power, the processor 60(k) may end the process of the present flowchart and shift to step S700a shown in FIG. 16.

4.3 Working Effects

The second embodiment controls the wavefront controller 50(k) on the basis of the beam radius Win(k+1) on the downstream side of the amplifier PA(k), thus making it possible to adjust the beam diameter of a pulse laser beam in the amplification region 73 so that the pulse laser beam may be efficiently amplified.

Further, the second embodiment makes it possible to control the wavefront controller 50(k) on the basis of data from the beam characteristics measurement unit 40(k) on the upstream side of the amplifier PA(k) before controlling on the basis of the beam radius Win(k+1) on the downstream side of the amplifier PA(k). This causes the pulse laser beam to be controlled not to strike the pair of electrodes 71 and 72 of the amplifier PA(k), thus making it possible to highly accurately control the wavefront controller 50(k) on the basis of the beam radius Win(k+1) on the downstream side of the amplifier PA(k).

5. LASER APPARATUS THAT DETERMINES WHETHER TO PERFORM BEAM CONTROL (THIRD EMBODIMENT)

5.1 Main Flow

Figure 19:
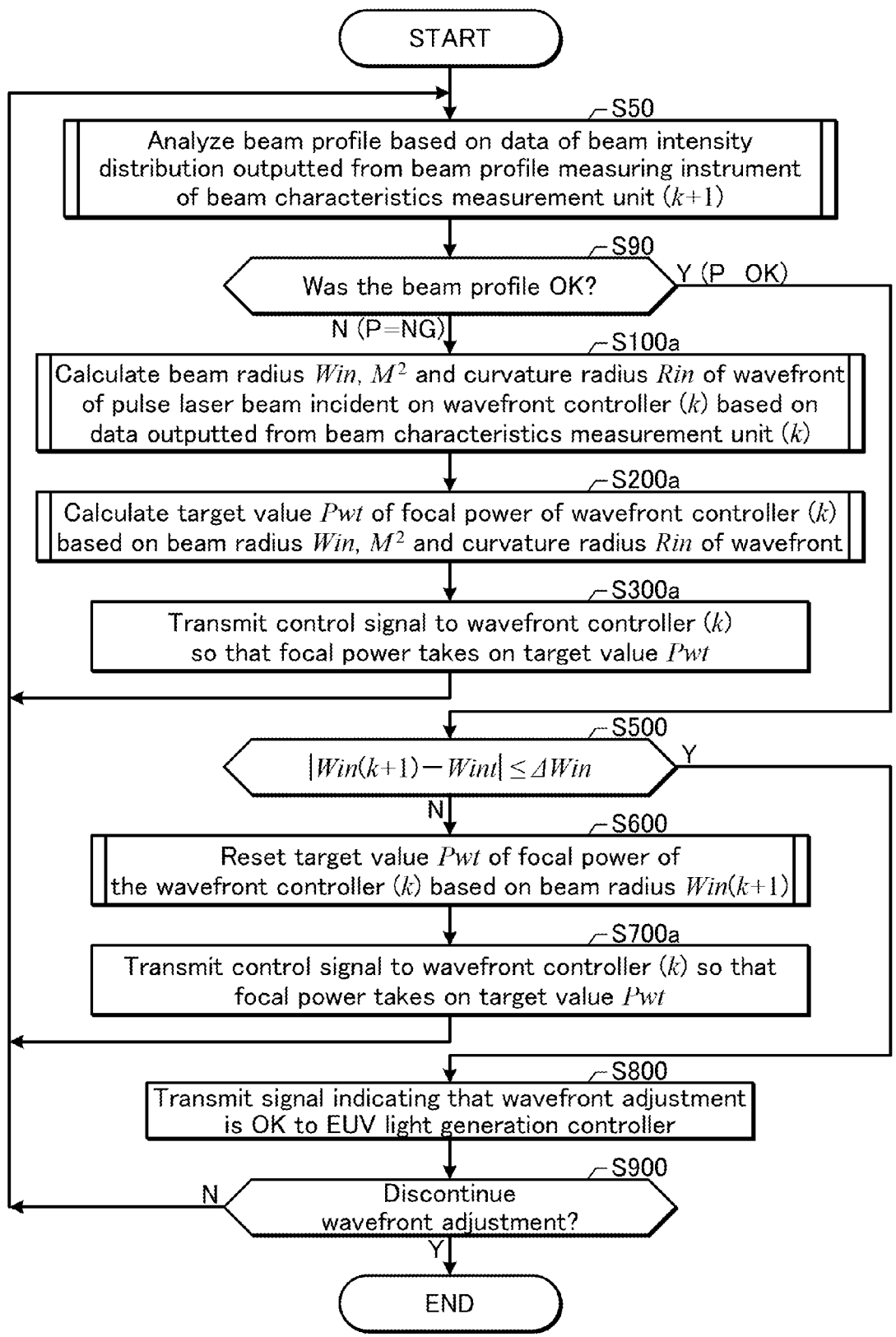
FIG. 19 is a flowchart showing an exemplary operation of a processor in a laser apparatus according to a third embodiment of the present disclosure.

FIG. 19 is a flowchart showing an exemplary operation of the processor 60(k) in a laser apparatus 3 according to a third embodiment of the present disclosure. A configuration of the laser apparatus 3 according to the third embodiment is neither described nor illustrated, as it is the same as the configuration of the laser apparatus 3 according to the second embodiment. The processor 60(k) may control the wavefront controller 50(k) through the following process.

First, in step S50, the processor 60(k) may analyze a beam profile on the basis of the data of the beam intensity distribution outputted from the beam profile measuring instrument 43 of the beam characteristics measurement unit 40(k+1). The analysis of the beam profile may include determination of the number of peaks of the beam intensity distribution and measurement of the beam radius Win(k+1). Details of this process will be described below with reference to FIG. 20A.

Next, in step S90, the processor 60(k) may determine whether a result of the analysis of the beam profile was OK or not good. If the result of the analysis of the beam profile was not good (S90; NO), the processor 60(k) may proceed to step S100a.

The processing from step S100a to step S300a may be the same as that described with reference to FIG. 16. After step S300a, the processor 60(k) may return to the above-described step S50 and repeat the processing from step S50 to step S90.

If, in step S90, the result of the analysis of the beam profile was OK (S90; YES), the processor 60(k) may proceed to step S500.

The processing from step S500 to step S700a may be the same as that described with reference to FIG. 16. After step S700a, the processor 60(k) may return to the above-described step S50 and repeat the processing from step S50 to step S500.

If, in step S500, the absolute value of the difference between the beam radius Win(k+1) and the target beam radius Wint is equal to or smaller than the predetermined threshold ΔWin (S500; YES), the processor may proceed to step S800.

The processing from step S800 to step S900 may be the same as that described with reference to FIG. 16.

In a case where, in step S900, the processor 60(k) does not discontinue the wavefront adjustment (S900; NO), the processor 60(k) may return to the above-described step 350 and repeat the processing from step S50 to step S900. In a case where, in step S900, the processor 60(k) discontinues the wavefront adjustment (3900; YES), the processor 60(k) may end the process of the present flowchart.

5.2 Analysis of Beam Profile

Figure 20A:
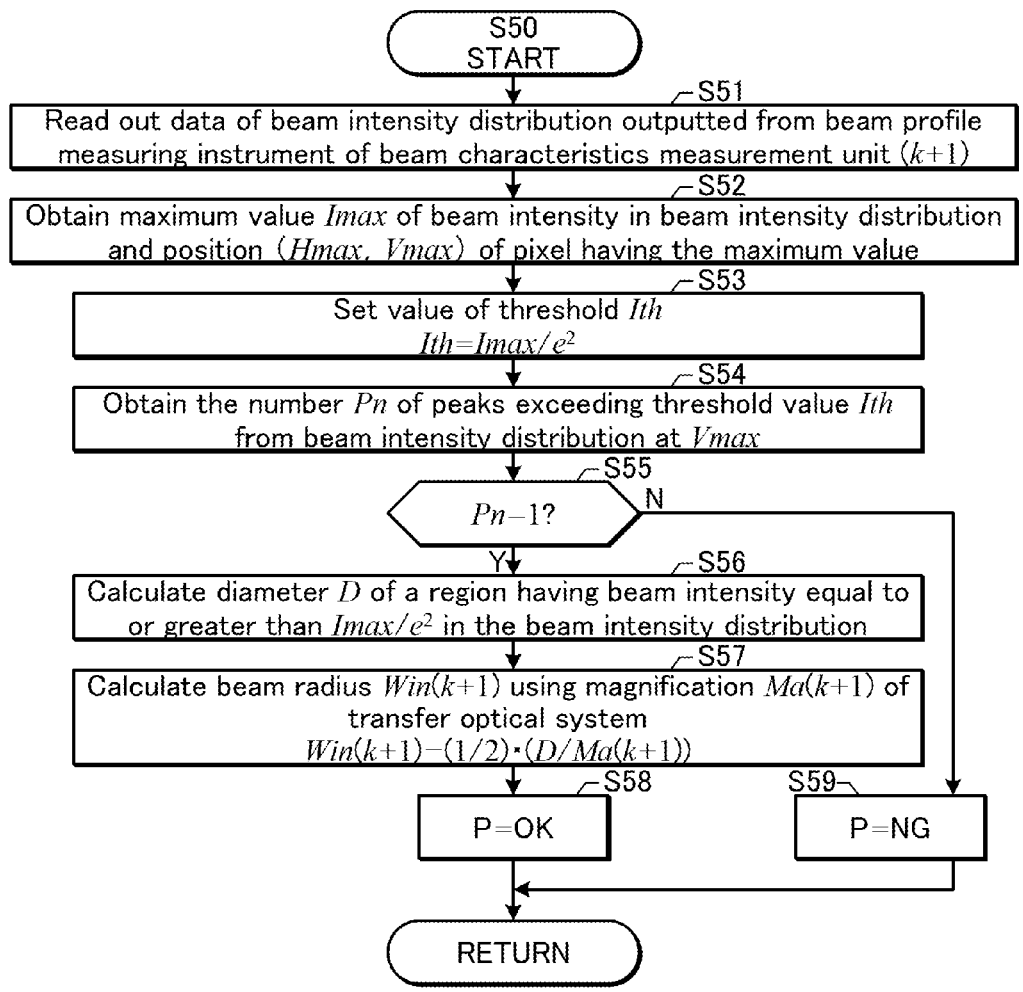
FIG. 20A is a flowchart showing details of a process in step S50 shown in FIG. 19.

FIG. 20A is a flowchart showing details of a process in step S50 shown in FIG. 19. The process shown in FIG. 20A may be performed by the processor 60(k) as a subroutine of step S50. In this process, the processor 60(k) may analyze the beam profile on the basis of the data of the beam intensity distribution outputted from the beam profile measuring instrument 43 of the beam characteristics measurement unit 40(k+1).

Figure 20B:
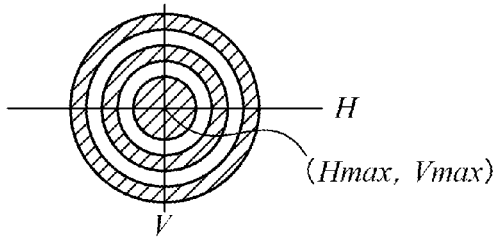
FIGS. 20B and 20C are diagrams for discussing the process shown in FIG. 20A.
Figure 20C:
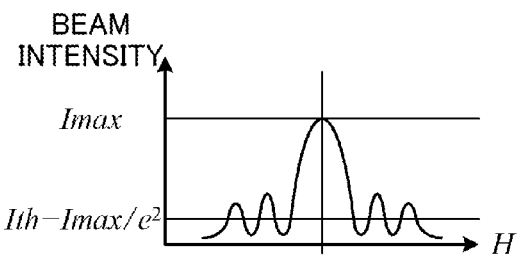

Each of FIGS. 20B and 20C is a diagram for discussing the process shown in FIG. 20A. FIG. 20B shows an example of the beam intensity distribution outputted from the beam profile measuring instrument 43 of the beam characteristics measurement unit 40(k+1). The position of a pixel having a maximum beam intensity in the beam intensity distribution shown in FIG. 20B may be indicated by coordinates (Hmax, Vmax). In FIG. 20B, the H axis and the V axis may intersect at a right angle at the coordinates (Hmax, Vmax). The direction of the H axis may coincide with the direction of discharge by the pair of electrodes 71 and 72. FIG. 20C shows a beam intensity distribution along the H axis, i.e., a beam intensity distribution at Vmax. FIG. 20C shows a maximum value Imax of beam intensity in the beam intensity distribution.

First, in step S51, the processor 60(k) may read out the data of the beam intensity distribution outputted from the beam profile measuring instrument 43 of the beam characteristics measurement unit 40(k+1).

Next, in step S52, the processor 60(k) may obtain the maximum value Imax of beam intensity in the beam intensity distribution and the position (Hmax, Vmax) of the pixel having the maximum value.

Next, in step S53, the processor 60(k) may set the value of a threshold Ith. The value of the threshold Ith may be set to Ith=Imax/$e^2$ by using the above-described maximum value Imax of beam intensity.

Next, in step S54, the processor 60(k) may obtain the number Pn of peaks exceeding the threshold value Ith from the beam intensity distribution at Vmax. When the beam intensity distribution is a Gaussian distribution, the number Pn of peaks is 1. However, as shown in FIG. 7, when a part of a pulse laser beam strikes the pair of electrodes 71 and 72 or the like, the number Pn of peaks may be a number of 2 or greater as shown in FIG. 20C.

Next, in step S55, the processor 60(k) may determine whether the number Pn of peaks is 1. If the number Pn of peaks is 1 (S55; YES), the processor 60(k) may proceed to step S56.

The processing in step S56 and step S57 may be the same as the processing in step S412 and step S413 shown in FIG. 17. After step S57, the processor 60(k) may proceed to step S58.

In step S58, the processor 60(k) may determine that the result of the analysis of the beam profile is OK. After step S58, the processor 60(k) may end the process of the present flowchart and shift to step S90 of FIG. 19.

If, in the above-described step S55, the number Pn of peaks is not 1 (S55; NO), the processor 60(k) may determine in step S59 that the result of the analysis of the beam profile is not good. After step S59, the processor 60(k) may end the process of the present flowchart and shift to step S90 of FIG. 19.

The third embodiment makes it possible to omit the processing from S100a to S300a shown in FIG. 19, provided the result of the analysis of the beam profile is OK. Therefore, the third embodiment may be simpler in process than the second embodiment.

6. LASER APPARATUS THAT PERFORMS BEAM CONTROL ACROSS A PLURALITY OF AMPLIFIERS (FOURTH EMBODIMENT)

Figure 21:
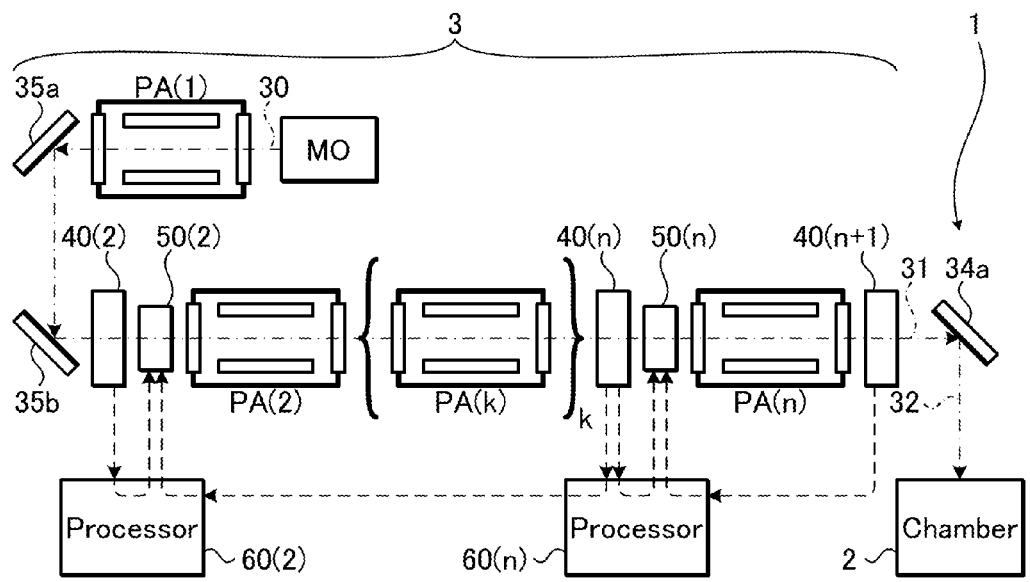
FIG. 21 is a partial sectional view illustrating a configuration of a laser apparatus according to a fourth embodiment of the present disclosure.

FIG. 21 is a partial sectional view illustrating a configuration of a laser apparatus 3 according to a fourth embodiment of the present disclosure. In the fourth embodiment, the beam characteristics measurement unit 40(k) and the wavefront controller 50(k) do not need to be provided on the upstream side of the amplifier PA(k). The beam characteristics measurement unit 40(2) and the wavefront controller 50(2) may be provided on the upstream side of the second amplifier PA(2).

The processor 60(2) may control the wavefront controller 50(2) on the basis of data outputted from the beam characteristics measurement unit 40(2) so that the pulse laser beam does not strike the electrodes of the amplifiers PA(2) and PA(k). Further, the processor 60(2) may control the wavefront controller 50(2) on the basis of data outputted from the beam characteristics measurement unit 40(n) provided on the downstream side of the amplifier PA(k) so that the pulse laser beam is efficiently amplified.

In other respects, the fourth embodiment may be the same as the above-described second and third embodiments.

It should be noted that although a case has been described where the wavefront controller 50(2) is controlled on the basis of the data outputted from the beam characteristics measurement unit 40(n), the fourth embodiment is not limited to this case. The wavefront controller 50(k) may be controlled across a plurality of upstream amplifiers on the basis of data outputted from a given beam characteristics measurement unit 40 (k+x). Note here that x may be an integer of 2 or greater.

7. OTHERS

7.1 Examples of Amplifier

7.1.1 First Example

Figure 22A:
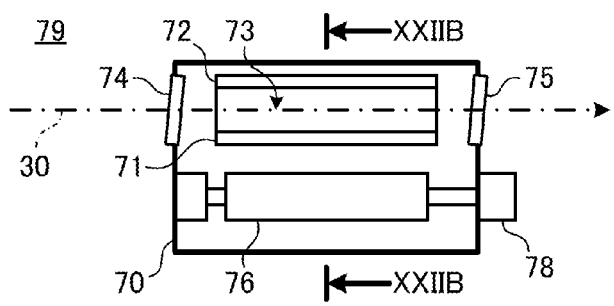
FIG. 22A is an internal transparent view illustrating a configuration of a triaxial orthogonal amplifier as a first example of an amplifier.
Figure 22B:
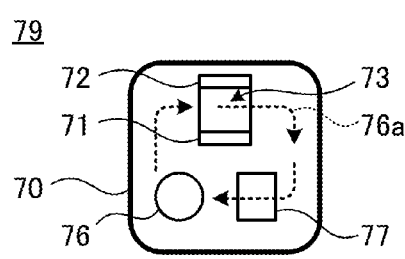
FIG. 22B is a cross-sectional view taken along the line XXIIB-XXIIB in FIG. 22A.

FIG. 22A is an internal transparent view illustrating a configuration of a triaxial orthogonal amplifier 79 as a first example of the amplifier PA(k). FIG. 22B is a cross-sectional view taken along the line XXIIB-XXIIB in FIG. 22A. The triaxial orthogonal amplifier 79 may be an amplifier in which the travel direction of the pulse laser beam 30 passing through the amplification region 73, the direction of flow 76a of a laser gas flowing through the amplification region 73, and the direction of discharge by the pair of electrodes 71 and 72 positioned with the amplification region 73 interposed therebetween are orthogonal to one another.

A cross flow fan 76 and a heat exchanger 77 may be provided inside the laser chamber 70. A motor 78 coupled to the cross flow fan 76 may be provided outside the laser chamber 70. The motor 78 may rotate a rotating shaft of the cross flow fan 76. The cross flow fan 76 may generate the flow 76 of the laser gas inside the laser chamber 70. The heat exchanger 77 may cause heat that is accumulated in the laser gas by discharge to be released out of the laser chamber 70.

The other points may be the same as those described with reference to FIG. 3.

7.1.2 Second Example

Figure 23:
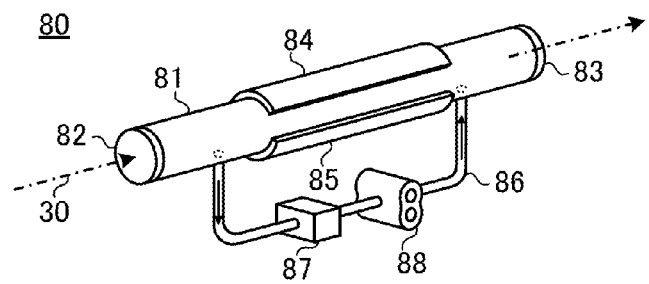
FIG. 23 is a perspective view illustrating a configuration of a high-speed axial-flow amplifier as a second example of the amplifier.

FIG. 23 is a perspective view illustrating a configuration of a high-speed axial-flow amplifier 80 as a second example of the amplifier PA(k). The high-speed axial-flow amplifier 80 may include a discharge tube 81, an entrance window 82, an exit window 83, a pair of electrodes 84 and 85, a gas tube 86, a heat exchanger 87, and an air blower 88.

The pulse laser beam 30 may enter the discharge tube 81 through the entrance window 82, pass through the discharge tube 81, and exit the discharge tube 81 through the exit window 83. The laser gas may be circulated through the discharge tube 81 by the gas tube 86 and the air blower 88. Application of a high-frequency voltage from a high-frequency power supply (not shown) to the pair of electrodes 84 and 85 provided at positions with the discharge tube 81 interposed therebetween may cause discharge to be generated in the discharge tube 81 to excite the laser gas to amplify the pulse laser beam 30 passing through the discharge tube 81. The heat that is accumulated in the laser gas by the discharge may be dissipated by the heat exchanger 87 provided on the gas tube 86.

It is desirable that the pulse laser beam have its wavefront adjusted so that the pulse laser beam does not strike an inner surface of the discharge tube 81. As the values of the above-described Din and Dout, the diameter of the entrance window 82 and the diameter of the exit window 83 may be used, respectively. In this case, as the values of the above-described Zin and Zout, the position of the entrance window 82 and the position of the exit window 83 may be used, respectively.

7.2 Examples of Wavefront Controller

7.2.1 First Example

Figure 24A:
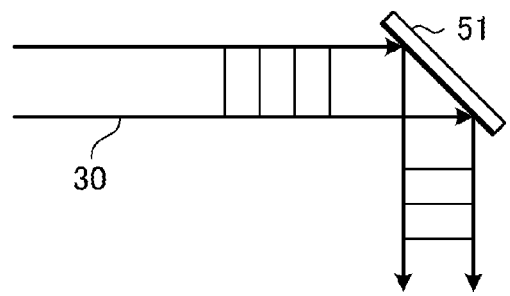
FIGS. 24A to 24C are conceptual diagrams of a variable radius mirror as a first example of the wavefront controller.
Figure 24B:
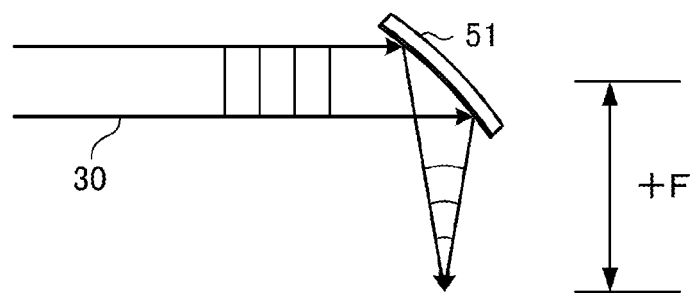
Figure 24C:
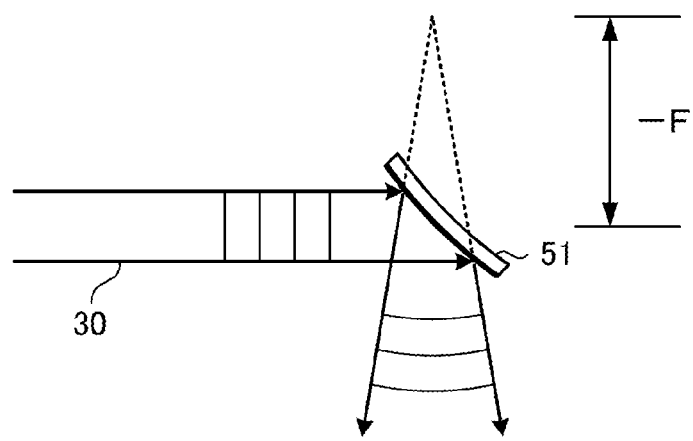

Each of FIGS. 24A to 24C is a conceptual diagram of a variable radius mirror 51 as a first example of the wavefront controller 50(k). The variable radius mirror 51 may be supported by a mirror holder (not shown) in a beam path of the pulse laser beam 30.

The variable radius mirror 51 may be a mirror of which the curvature of the reflective surface can be modified. The variable radius mirror 51 may be transformed to be a flat mirror as shown in FIG. 24A. Here, the focal power Pw of the variable radius mirror 51 may be substantially 0. The variable radius mirror 51 may also be transformed to be a concave mirror with a focal length +F as shown in FIG. 24B. Here, the focal power Pw of the variable radius mirror 51 may have a positive value. The variable radius mirror 51 may also be transformed to be a convex mirror with a focal length −F as shown in FIG. 24C. Here, the focal power Pw of the variable radius mirror 51 may have a negative value. Thus, the variable radius mirror 51 may adjust the wavefront of a pulse laser beam.

Figure 24D:
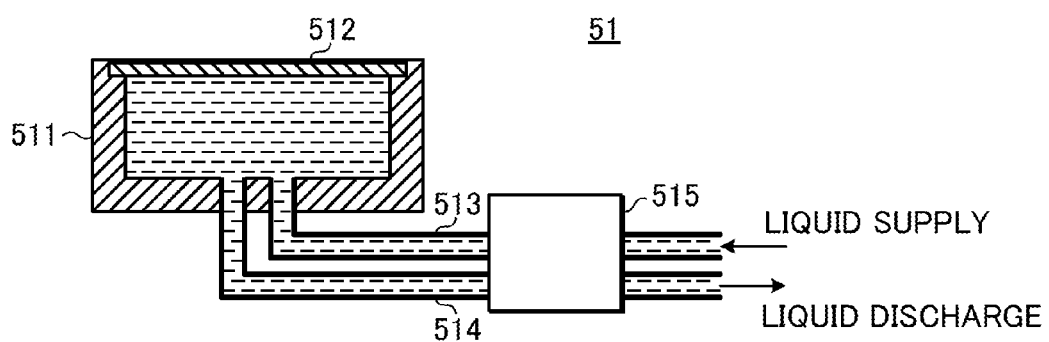
FIG. 24D is a partial sectional view illustrating a specific configuration of each of the variable radius mirrors shown in FIGS. 24A to 24C.

FIG. 24D is a partial sectional view illustrating a specific configuration of each of the variable radius mirrors 51 shown in FIGS. 24A to 24C. The variable radius mirror 51 may include a pressure cavity 511, a reflector 512, a supply pipe 513, a discharge pipe 514, and a pressure adjuster 515.

The pressure cavity 511 may be a rigid container in which a liquid such as water is stored. The reflector 512 may be an elastic plate fitted into an opening of the pressure cavity 511. A reflective layer reflecting the pulse laser beam with high reflectance may be formed on one surface of the reflector 512, and this surface of the reflective layer may be exposed to the exterior of the pressure cavity 511.

One end of each of the supply pipe 513 and the discharge pipe 514 may be connected to the pressure cavity 511. The other end of each of the supply pipe 513 and the discharge pipe 514 may be connected to the pressure adjuster 515.

The pressure adjuster 515 may supply a liquid into the pressure cavity 511 through the supply pipe 513 to increase a pressure inside the pressure cavity 511 based on a control signal outputted from the processor 60(k). The pressure adjuster 515 may discharge a liquid from the pressure cavity 511 through the discharge pipe 514 to decrease a pressure inside the pressure cavity 511 based on a control signal outputted from the processor 60(k).

By increasing and decreasing a pressure inside the pressure cavity 511, the curvature of the reflective layer of the reflector 512 may be controlled. Thus, the wavefront of the pulse laser beam 30 reflected by the reflective layer of the reflector 512 may be controlled.

7.2.2 Second Example

Figure 25:
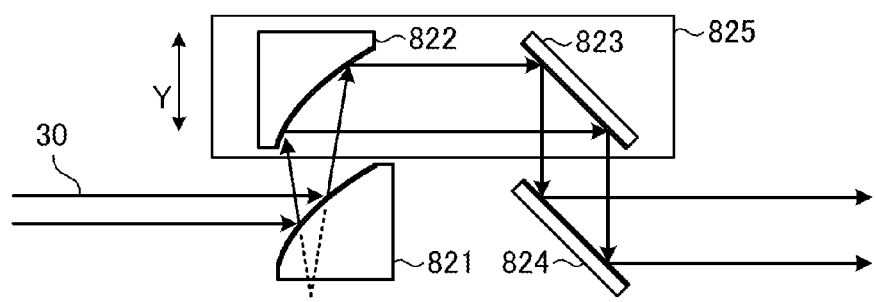
FIG. 25 shows a second example of the wavefront controller.

FIG. 25 shows a second example of the wavefront controller 50(k). The wavefront controller 50(k) may include an off-axis paraboloidal convex mirror 821, an off-axis paraboloidal concave mirror 822, flat mirrors 823 and 824, and a mirror fixing plate 825.

The off-axis paraboloidal convex mirror 821 may be fixed by a mirror holder (not shown) in the beam path of the pulse laser beam 30. The off-axis paraboloidal convex mirror 821 may reflect the pulse laser beam 30 toward the off-axis paraboloidal concave mirror 822.

The off-axis paraboloidal concave mirror 822 may be fixed to the mirror fixing plate 825 through a mirror holder (not shown). The off-axis paraboloidal concave mirror 822 may reflect the pulse laser beam 30 reflected by the off-axis paraboloidal convex mirror 821 toward the flat mirror 823.

The flat mirror 823 may be fixed to the mirror fixing plate 825 through another mirror holder (not shown). The flat mirror 823 may reflect the pulse laser beam 30 reflected by the off-axis paraboloidal concave mirror 822 toward the flat mirror 824.

The flat mirror 824 may be fixed by a mirror holder (not shown) in a beam path of the pulse laser beam 30 reflected by the flat mirror 823. The flat mirror 824 may reflect the pulse laser beam 30 toward the amplifier PA(k).

The mirror fixing plate 825 may be movable along the double-head arrow Y through a driving mechanism (not shown). The wavefront of the pulse laser beam 30 may be adjusted by increasing or decreasing the distance from the mirror fixing plate 825 to the off-axis paraboloidal convex mirror 821 and the flat mirror 824. To have a focal power of substantially 0, the wavefront controller 50(k) may be adjusted so that the focusing point of the off-axis paraboloidal convex mirror 821 and the focusing point of the off-axis paraboloidal concave mirror 822 are the same as each other.

7.2.3 Third Example

Figure 26A:
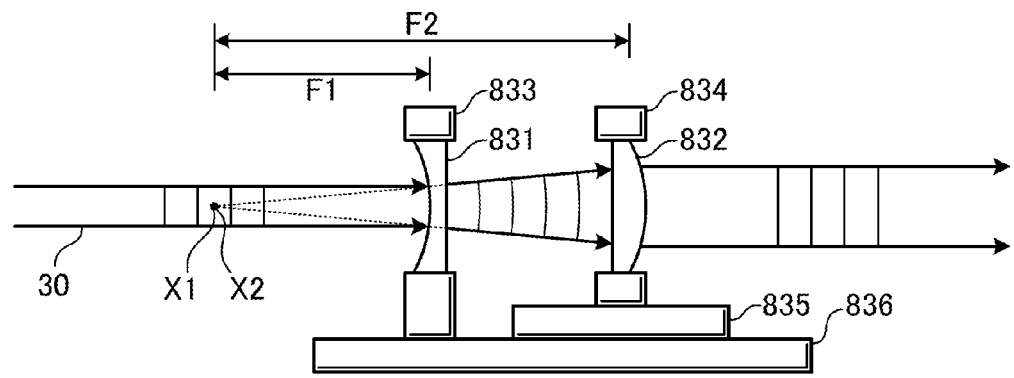
FIG. 26A to 26C illustrate a configuration of a third example of the wavefront controller.
Figure 26B:
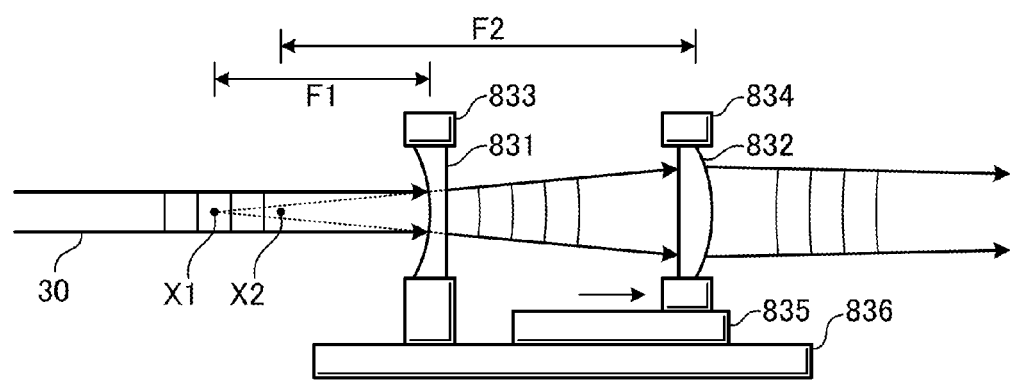
Figure 26C:
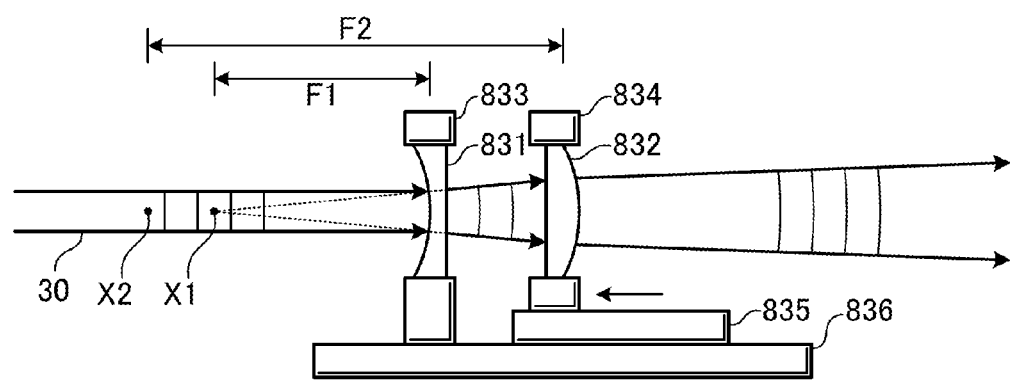

Each of FIGS. 26A to 26C illustrates a configuration of a third example of the wavefront controller 50(k). The wavefront controller 50(k) may include a concave lens 831 and a convex lens 832.

The concave lens 831 may be fixed by a mirror holder 833 at a position on which the pulse laser beam 30 is incident. The mirror holder 833 may be fixed to a fixing plate 836. The concave lens 831 may transmit the pulse laser beam 30.

The convex lens 832 may be held by a mirror holder 834 at a position on which the pulse laser beam 30 transmitted through the concave lens 831 is incident. The mirror holder 834 may be held by the fixing plate 836 through a linear stage 835. The linear stage 835 may support the mirror holder 834 such that the convex lens 832 held by the mirror holder 834 can reciprocate relative to the fixing plate 836 along a beam axis of the pulse laser beam 30. The convex lens 832 may transmit the pulse laser beam 30 toward the amplifier PA(k).

The concave lens 831 may have a front focusing point X1 at a position separated from the principal point of the concave lens 831 by a focal length 71 toward the upstream side of the pulse laser beam 30. The convex lens 832 may have a front focusing point X2 at a position separated from the principal point of the convex lens 832 by a focal length F2 toward the upstream side of the pulse laser beam 30. As shown in FIG. 26A, when the front focusing point X1 of the concave lens 831 and the front focusing point X2 of the convex lens 832 coincide with each other, the focal power of the wavefront controller 50(k) may be substantially 0.

As shown in FIG. 24B, the linear stage 835 may move the convex lens 832 to the downstream side of the pulse laser beam 30, which may move the front focusing point X2 of the convex lens 832 toward the more downstream side of the pulse laser beam 30 than the front focusing point X1 of the concave lens 831. Here, the focal power of the wavefront controller 50(k) may have a positive value.

As shown in FIG. 26C, the linear stage 835 may move the convex lens 832 to the upstream side of the pulse laser beam 30, which may move the front focusing point X2 of the convex lens 832 toward the more upstream side of the pulse laser beam 30 than the front focusing point X1 of the concave lens 831. Here, the focal power of the wavefront controller 50(k) may have a negative value.

Thus, the wavefront controller may adjust the wavefront of the pulse laser beam 30.

7.3 Configuration of Processor

Figure 27:
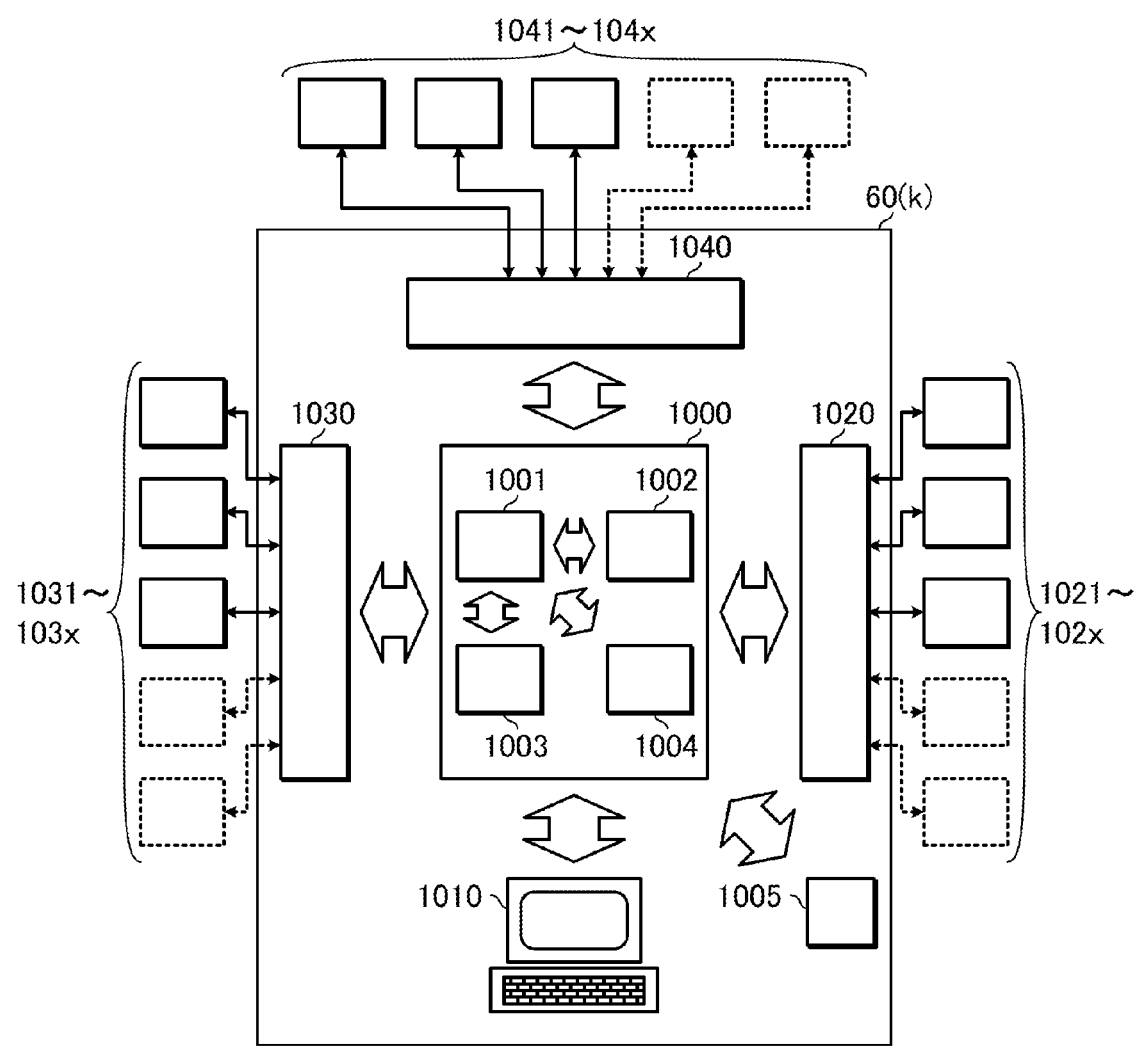
FIG. 27 is a block diagram schematically illustrating an exemplary configuration of a processor.

FIG. 27 is a block diagram schematically illustrating an exemplary configuration of the processor 60(k).

The processor 60(k) in the above-described embodiments may be constituted by a general-purpose control device such as a computer or a programmable controller. For example, the processor 60(k) may be constituted as described below.
(Configuration)

The processor 60(k) may include a processing unit 1000, and a storage memory 1005, a user interface 1010, a parallel input/output (I/O) controller 1020, a serial I/O controller 1030, and an analog-to-digital (A/D) and digital-to-analog (D/A) converter 1040 that are connected to the processing unit 1000. The processing unit 1000 may include a central processing unit (CPU) 1001, and a memory 1002, a timer 1003, and a graphics processing unit (GPU) 1004 that are connected to the CPU 1001.
(Operation)

The processing unit 1000 may read out programs stored in the storage memory 1005. The processing unit 1000 may execute read-out programs, read out data from the storage memory 1005 in accordance with the execution of the programs, or store data in the storage memory 1005.

The parallel I/O controller 1020 may be connected to devices 1021 to 102x communicable through parallel I/O ports. The parallel I/O controller 1020 may control communication using digital signals through parallel I/O ports that is performed in the process where the processing unit 1000 executes programs.

The serial I/O controller 1030 may be connected to devices 1031 to 103x communicable through serial I/O ports. The serial I/O controller 1030 may control communication using digital signals through serial I/O ports that is performed in the process where the processing unit 1000 executes programs.

The A/D and D/A converter 1040 may be connected to devices 1041 to 104x communicable through analog ports. The A/D and D/A converter 1040 may control communication using analog signals through analog ports that is performed in the process where the processing unit 1000 executes programs.

The user interface 1010 may be configured to display progress of executing programs by the processing unit 1000 to an operator or to receive instructions by the operator to the processing unit 1000 to stop execution of the programs or to execute interruption processing.

The CPU 1001 of the processing unit 1000 may perform arithmetic processing of programs. In the process where the CPU 1001 executes programs, the memory 1002 may temporally store programs or temporally store data in the arithmetic process. The timer 1003 may measure time or elapsed time to output the time or the elapsed time to the CPU 1001 in accordance with the execution of the programs. When image data is input to the processing unit 1000, the GPU 1004 may process the image data in accordance with the execution of the programs and output the results to the CPU 1001.

The devices 1021 to 102x communicable through parallel I/O ports, which are connected to the parallel I/O controller 1020, may be the EUV light generation controller 5, another controller, or the like.

The devices 1031 to 103x communicable through serial I/O ports, which are connected to the serial I/O controller 1030, may be the wavefront controller 50(k), the uniaxial stage 49, or the like.

The devices 1041 to 104x communicable through analog ports, which are connected to the A/D and D/A converter 1040, may be various sensors such as the optical sensor 45 and the optical sensor 48.

With the above-described configuration, the processor 60(k) may be capable of achieving the operation illustrated in the flowchart.

The above-described embodiments and the modifications thereof are merely examples for implementing the present disclosure, and the present disclosure is not limited to these examples. Making various modifications according to the specifications is within the scope of the present disclosure, and other various modifications are possible within the scope of the present disclosure. The modifications illustrated for one of the embodiments can be applied to other embodiments as well (including the other embodiments described herein).

The terms used in the entirety of this specification and the appended claims should be interpreted as "non-limiting" terms. For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more".

The invention claimed is:

1. A laser apparatus, comprising:
a beam splitter configured to split a pulse laser beam into a first beam path and a second beam path;
an optical sensor provided in the first beam path;
an amplifier including an amplification region provided in the second beam path and being configured to amplify and emit the pulse laser beam incident thereon along the second beam path;
a wavefront controller provided in the second beam path between the beam splitter and the amplifier; and
a processor configured to receive an output signal from the optical sensor and transmit a control signal to the wavefront controller,
wherein the processor transmits the control signal to the wavefront controller to reduce a maximum value of a beam diameter of the pulse laser beam between first and second positions positioned in the second optical path, the amplification region being interposed between the first and second positions.

2. A laser apparatus, comprising:
a first beam splitter configured to split a pulse laser beam into a first beam path and a second beam path;
a first optical sensor provided in the first beam path;
an amplifier including an amplification region provided in the second beam path and being configured to amplify and emit the pulse laser beam incident thereon along the second beam path;
a wavefront controller provided in the second beam path between the first beam splitter and the amplifier;
a second beam splitter configured to split the pulse laser beam emitted from the amplifier into a third beam path and a fourth beam path;
a second optical sensor provided in the third beam path; and
a processor configured to receive an output signal from the first optical sensor and transmit a first control signal to the wavefront controller and, after that, receive an output signal from the second optical sensor and transmit a second control signal to the wavefront controller,
wherein the processor receives the output signal from the first optical sensor and transmits the first control signal to the wavefront controller to reduce a maximum value of a beam diameter of the pulse laser beam between first and second positions positioned in the second optical path, the amplification region being interposed between the first and second positions.

3. The laser apparatus according to claim 2, wherein the processor receives the output signal from the second optical sensor, calculates the beam diameter of the pulse laser beam emitted from the amplifier, compares the beam diameter thus calculated to a target beam diameter, and transmits the second control signal to the wavefront controller so that the beam diameter of the pulse laser beam emitted from the amplifier becomes closer to the target beam diameter.

4. A laser apparatus, comprising:
a first beam splitter configured to split a pulse laser beam into a first beam path and a second beam path;
a first optical sensor provided in the first beam path;
an amplifier including an amplification region provided in the second beam path and being configured to amplify and emit the pulse laser beam incident thereon along the second beam path;
a wavefront controller provided in the second beam path between the first beam splitter and the amplifier;
a second beam splitter configured to split the pulse laser beam emitted from the amplifier into a third beam path and a fourth beam path;
a second optical sensor provided in the third beam path; and
a processor configured to receive an output signal from the first optical sensor and transmit a first control signal to the wavefront controller and, after that, receive an output signal from the second optical sensor and transmit a second control signal to the wavefront controller,
wherein the processor receives the output signal from the second optical sensor and determines a state of the pulse laser beam emitted from the amplifier,
in a case where a first determination result has been obtained, the processor receives the output signal from the first optical sensor and transmits the first control signal to the wavefront controller and, after that, receives the output signal from the second optical sensor and transmits the second control signal to the wavefront controller, and
in a case where a second determination result has been obtained, the processor transmits the second control signal to the wavefront controller.

* * * * *